United States Patent
Kodama et al.

(10) Patent No.: US 7,568,624 B2
(45) Date of Patent: Aug. 4, 2009

(54) COMPONENT-SUPPLYING-DEVICE-RELATED-INFORMATION READING APPARATUS

(75) Inventors: Seigo Kodama, Ama-gun (JP); Takahiro Jindo, Okazaki (JP)

(73) Assignee: Fuji Machine Mfg. Co., Ltd., Aichi-ken (JP)

( * ) Notice: Subject to any disclaimer, the term of this patent is extended or adjusted under 35 U.S.C. 154(b) by 527 days.

(21) Appl. No.: 10/549,195

(22) PCT Filed: Mar. 19, 2004

(86) PCT No.: PCT/JP2004/003807

§ 371 (c)(1), (2), (4) Date: Sep. 16, 2005

(87) PCT Pub. No.: WO2004/086839

PCT Pub. Date: Oct. 7, 2004

(65) Prior Publication Data

US 2006/0208058 A1   Sep. 21, 2006

(30) Foreign Application Priority Data

Mar. 25, 2003   (JP) .............................. 2003-083382

(51) Int. Cl.
*G06K 7/10* (2006.01)

(52) U.S. Cl. .............................. 235/462.14; 235/462.08; 235/462.43; 235/454

(58) Field of Classification Search ................. 235/462, 235/462.14, 462.08, 462.43, 454; 700/117, 700/17
See application file for complete search history.

(56) References Cited

U.S. PATENT DOCUMENTS 5,515,600 A * 5/1996 Iwasaki et al. ................. 29/740
5,567,927 A * 10/1996 Kahn et al. ............. 235/462.01

FOREIGN PATENT DOCUMENTS

| JP | A 5-21993  | 1/1993 |
| JP | A 5-055792 | 3/1993 |
| JP | A 8-078881 | 3/1996 |

* cited by examiner

*Primary Examiner*—Michael G Lee
*Assistant Examiner*—Michael Andler
(74) *Attorney, Agent, or Firm*—Oliff & Berridge, PLC

(57) ABSTRACT

A component supplying system including a plurality of electronic-component supplying devices arranged to read from an information indicator information, such as ID, that is related to the each supplying device. A guide unit defines the track extending in the direction in which the supplying devices are arranged and that allows the reading unit to be moved along the track. The reading unit detachably attached to the guide unit. The reading unit can perform a reading operation irrespective of the directions the unit is moved along the track. In addition, the reading unit can be moved manually. The guide unit is detachably attached to a component supplying system, and the reading unit includes a wireless transmitter 182 that transmits the read information.

3 Claims, 12 Drawing Sheets

COMPONENT-SUPPLYING-DEVICE-RELATED-INFORMATION READING APPARATUS

TECHNICAL FIELD

The present invention relates to a component-supplying-device-related-information reading apparatus that is used, in a component supplying system that is provided in, e.g., a component mounting machine and supplies circuit components, to obtain information related to a plurality of component supplying devices constituting the component supplying system.

BACKGROUND ART

A component mounting machine that mounts circuit components such as electronic components on a circuit substrate such as a circuit board, employs a plurality of component supplying devices (e.g., feeders or trays) that supply the circuit components. Usually, a single component mounting machine mounts many sorts of circuit components. Thus, the component mounting machine employs a component supplying system including a plurality of component supplying devices. Therefore, for example, information about whether the component supplying devices are provided at respective predetermined positions, is information about whether the component supplying devices are ones that supply respective predetermined sorts of circuit components is important information for the component mounting machine to perform an appropriate component mounting operation. A device that obtains the above-indicated information that is related to the component supplying devices is disclosed by, e.g., Japanese Patent Application Publication No. 8-78881 or Japanese Patent Application Publication No. 5-21993.

DISCLOSURE OF THE INVENTION

The device disclosed by the above-indicated patent documents is a reading device, i.e., a bar-code reader that is provided in a mounting head (e.g., a rotary-type mounting head employed by the component mounting machine disclosed by the above-indicated first patent document) and reads a bar code provided on each feeder or each tray. Therefore, in order that the reading device may read the information related to each component supplying device, the mounting head requires an exclusive control corresponding to the reading operation of the reading device. In addition, since the reading device includes a mechanism for moving the mounting head, the size of the reading device per se is increased. Moreover, each component mounting machine needs to employ one bar-code reader.

It is therefore an object of the present invention to provide a simple component-supplying-device-related-information reading apparatus. This object may be achieved according to any of the following modes of the present invention in the form of a component-supplying-device-related-information reading apparatus, each of which is numbered like the appended claims and may depend from the other mode or modes, where appropriate, to indicate and clarify possible combinations of technical features. It is, however, to be understood that the present invention is not limited to the technical features or any combinations thereof that will be described below for illustrative purposes only. It is to be further understood that a plurality of features included in any one of the following modes of the invention are not necessarily provided altogether, and that the invention may be embodied without at least one of the features described with respect to each of the modes.

(1) A component-supplying-device-related-information reading apparatus which is used, in a component supplying system including a plurality of component supplying devices each of which supplies a plurality of circuit components, for reading, from an information indicator provided on each of the component supplying devices, component-supplying-device-related information which is related to said each component supplying device, the apparatus comprising:

a guide which defines a track extending in a direction in which the component supplying devices are arranged in the component supplying system; and a reader which is engaged with the guide such that the reader is movable along the track, and which includes an information reading portion which reads, from the information indicator provided on at least one of the component supplying devices, the component-supplying-device-related information related to said at least one component supplying device.

In short, the component-supplying-device-related-information reading apparatus in accordance with the present invention includes the reader and the guide that guides the reader, and need not move a mounting head to move the reader, unlike the above-described conventional reading device. Thus, the present apparatus can enjoy a simple construction.

The above-indicated component supplying devices include, e.g., a feeder such as a tape feeder that feeds an electronic-component tape carrying a plurality of electronic components and thereby supplies the electronic components, one by one; or a bulk feeder that includes a container in which a plurality of electronic components are stored in bulk, and supplies, from the container, the electronic components, one by one, while arranging the components into an array. The component supplying system include, e.g., a plurality of feeders that are arranged along a reference line. In addition, a tray-type component supplying system can be said as a sort of component supplying system to which the present invention can be applied. The tray-type component supplying system includes a plurality of trays each of which holds a plurality of circuit components arranged in one or more arrays and which are stacked on each other such that the circuit components can be sequentially taken out from the trays. In this system, the trays correspond to the above-indicated component supplying devices, respectively. However, the above-indicated component supplying devices may not be all the component supplying devices that are employed by the component supplying system. For example, the component supplying system may include one or more component supplying devices from which no information is read by the reader. That is, the component supplying devices employed according to the present invention are just objects from information is read by the reader, and the present invention is not related to any component supplying devices from which information is not read by the reader.

The component-supplying-device-related information may be information related to each component supplying device per se, such as a type or an identification (ID) thereof, or information related to circuit components supplied by the each component supplying device, such as a sort, a type, or a dimension of the circuit components. The information indicator that indicates the component-supplying-device-related information related to each component supplying device is by no means limited to any specific forms, i.e., may take any of various known forms that can record the information and can be read by a known reading means such as an optical or magnetic reader. For example, the information indicator may be a bar code or a two-dimensional (2D) code (also called "QR code" or "two-dimensional bar code"). A label on which the information indicator is printed may be adhered to an appropriate portion of each component supplying device. Alternatively, the information indicator may be formed by being directly printed, or carved, on an appropriate portion of each component supplying device.

The guide may be one that includes a track-defining member, such as a guide rail or any other sort of guide member, that defines a track. In the case where the component supplying devices are arranged along a straight line, the track is defined along the straight line; and in the case where the component supplying devices are arranged along a curved line such as a portion of a circle, the track is defined along the curved line. The reader is movable along the track. More specifically described, the reader may be one that includes an engaging portion that engages the track-defining member and thereby assures that the reader is movable along the track. The information reading portion of the reader may take an appropriate one of various known forms, depending upon a sort of the information indicator. For example, the information reading portion may be an optical reading means such as a bar-code reader, a charge-coupled-device (CCD) camera, or a line-scan camera; or a magnetic reading means such as a magnetic pick-up device.

(2) The component-supplying-device-related-information reading apparatus according to the mode (1), wherein the reader is detachably attached to the guide.

According to the principle of the present invention, the reader may be one that is separable from the guide, or one that is not separable from the same. According to the second mode (2), the reader is separable from the guide. Therefore, for example, when the reader is used to read the component-supplying-device-related information, the reader is attached to the guide, and otherwise the reader remains detached from the same. In the case where a plurality of guides are provided in a plurality of component supplying systems, respectively, a single reader may be commonly used with each of those guides. In this case, the component supplying systems, or a plurality of component mounting machines employing the component supplying systems, respectively, need not employ respective readers, and accordingly the present information reading apparatus is very convenient. That is, the reader of the present reading apparatus enjoys a high usability.

(3) The component-supplying-device-related-information reading apparatus according to the mode (1) or (2), wherein the information reading portion reads, from the information indicator provided on said each of the plurality of component supplying devices, the component-supplying-device-related information related to said each component supplying device, during a corresponding one of a plurality of reading actions.

According to the principle of the present invention, the information reading portion may be one that simultaneously reads respective sets of component-supplying-device-related information that are related to a plurality of component supplying devices, for example, two or more component supplying devices that are located adjacent to each other. In contrast, according to the third mode (3), the information reading portion is one that reads, during each one of a plurality of repetitive reading actions thereof, a set of component-supplying-device-related information related to a corresponding one of the component supplying devices. According to this mode, the reader enjoys a simple construction, a small size, or a low production cost.

(4) The component-supplying-device-related-information reading apparatus according to any of the modes (1) through (3), wherein the reader is moved along the track, with an external drive force which is externally applied to the apparatus.

According to the principle of the present invention, the information reading apparatus may employ a drive source that drives or moves the reader. For example, the reader per se may include, e.g., an electric motor, or alternatively the guide may include the same. In contrast, according to the fourth mode (4), the information reading apparatus need not employ a drive source for moving the reader. Therefore, the present information reading apparatus enjoys a small size.

(5) The component-supplying-device-related-information reading apparatus according to the mode (4), wherein the reader is moved along the track, with a human power as the external drive force.

According to this mode, the reader may be operated and moved by a hand of an operator. Since no drive source such as an electric motor is needed, the present information reading apparatus enjoys a simple construction.

(6) The component-supplying-device-related-information reading apparatus according to any of the modes (1) through (5), wherein the information reading portion reads, as the component-supplying-device-related information related to said each of the component supplying devices, at least identification information which identifies said each component supplying device from the other component supplying device or devices.

As described above, the component-supplying-device-related information may be any of various sorts of information. According to this mode, the component-supplying-device-related information includes at least identification (ID) information that identifies each one of the component supplying devices from the other component supplying device or devices, and may consist of the ID information only. The ID information is proper to the each component supplying device, and is advantageously used to distinguish the each component supplying device from the other component supplying device or devices. In addition, for example, in the case where information related to the circuit components supplied by each component supplying device (e.g., the sort or type of the circuit components) is stored, in advance, in association with the ID information of the each component supplying device, the component-related information may be indirectly obtained based on the ID information read from the each component supplying device.

(7) The component-supplying-device-related-information reading apparatus according to any of the modes (1) through (6), wherein while the reader is moved along the track, the reader reads, from the information indicator provided on said each of the component supplying devices, the component-supplying-device-related information related to said each component supplying device.

According to this mode, the reader can be moved in a direction in which the component supplying devices are arranged, so as to scan the respective information indicators provided on the component supplying devices and thereby read the respective sets of component-supplying-device-related information related to the component supplying devices. Thus, the reader can efficiently read the sets of component-supplying-device-related information.

(8) The component-supplying-device-related-information reading apparatus according to the mode (7), wherein while the reader is moved in an arbitrary one of opposite directions along the track, the reader reads, from the information indicator provided on said each of the component supplying devices, the component-supplying-device-related information related to said each component supplying device.

According to this mode, the reader may be moved in an arbitrary one of opposite directions along the track, so as to scan the information indicators. Therefore, as compared with the case where the reader is moved in only one of the opposite directions along the track, so as to scan the information indicators, the information reading apparatus is more convenient. In the present information reading apparatus, it is preferred to employ a reader-movement-direction recognizing device that recognizes in which one of the opposite directions along the track the reader is being moved. As will be described later, the reader-movement-direction recognizing device is advantageously used, e.g., in the case where respective reading positions where the reader reads the respective sets of component-supplying-device-related information related to the component supplying devices are determined and, while the reader is moved to scan the information indicators, it is needed to recognize at which one of the thus determined reading positions the reader is being positioned.

(9) The component-supplying-device-related-information reading apparatus according to any of the modes (1) through (8), further comprising a reading-position determining device which determines at least one reading position which is taken by the reader on the track so as to read the component-supplying-device-related information related to said each of the component supplying devices.

In the case where it is needed to read the information indicators, at respective reading positions corresponding to the respective positions where the component supplying devices are provided, in the direction in which the component supplying devices are arranged, the ninth mode (9) is advantageous because those reading positions are determined on the track. According to this mode, each of the reading positions may be determined by inhibiting, with an appropriate position-control means such as a stopper means, the reader from being freely moved therefrom. That is, each reading position may be so-called "mechanically" determined. Alternatively, in the case where a memory means for storing respective predetermined positions corresponding to the component supplying devices, and a recognizing means for recognizing, in a state in which the reader is attached to the guide, a current position of the reader on the track are employed, the recognized current position of the reader may be determined as one of the reading positions, if the recognized current position coincides with one of the stored predetermined positions. In this case, the reading-position determining device may include a measuring device such as a position encoder, and a control device that has the function of judging, based on a signal supplied from the measuring device, whether the current position of the reader coincides with one of the predetermined positions. That is, each reading position may be so-called "electrically" determined.

The reading-position determining device may be one that is provided in either one of the reader and the guide, or one that is provided in both of the reader and the guide, or alternatively one that includes a portion thereof that is not provided in either of the reader and the guide. Each of the reading positions is not limited to a point, but may be defined as a range having a certain width, that is, a segment having a certain length.

(10) The component-supplying-device-related-information reading apparatus according to the mode (9), wherein the reading-position determining device determines a plurality of said reading positions each of which is taken by the reader on the track so as to read the component-supplying-device-related information related to a corresponding one of the component supplying devices.

According to this mode, each of the reading positions can be associated with the component-supplying-device-related information read at the each reading position. More specifically described, the reading-position determining device can recognize at which one of the reading positions the reader is being positioned along the track. For example, in the case where the component supplying system is constructed such that the component supplying devices are provided at respective predetermined positions, it may be needed to obtain information about which one of the component supplying devices, or which sort of component supplying device is provided at each of those predetermined positions. The present information reading apparatus is advantageous for this case.

(11) The component-supplying-device-related-information reading apparatus according to the mode (9) or (10), wherein the reading-position determining device comprises a reader-position recognizing portion which recognizes a current position of the reader on the track, and a reading-position determining portion which determines each of a plurality of said reading positions based on the recognized current position of the reader.

According to this mode, for example, respective positions corresponding to the reading positions may be predetermined on the track of the reader, as previously explained. In this case, each of the reading positions may be determined by recognizing a current position of the reader on the track and comparing the recognized current position of the reader with each one of the predetermined positions.

(12) The component-supplying-device-related-information reading apparatus according to the mode (11), wherein the reader-position recognizing portion comprises a plurality of position indicators which are provided along the track in the guide such that the position indicators correspond to respective positions where the component supplying devices are provided; and a position-indicator-related-position detecting portion which is provided in the reader and detects that the reader has a predetermined positional relationship relative to one of the position indicators, and wherein the reader-position recognizing portion recognizes the current position of the reader based on a result of the detection.

The position indicators are not limited to any specific forms. For example, each position indicator may be an indicia (e.g., a mark), a portion having a different shape than other portions (e.g., a projection, a groove, or a hole), or a special portion that is physically recognizable (e.g., an illuminating portion, or a magnetized portion). According to this mode, the reader may include a recognizing means that recognizes each one of the position indicators and may determine, based on a result of the recognition, the current position of the reader. More specifically described, the reader may include a position-indicator detector (e.g., an optical sensor, a magnetic sensor, or other sorts of sensors) that detects a presence of each one of the position indicators and outputs a signal representing the presence of the each position indicator, and the reader may detect, based on the signal supplied from the detector, a current position of the reader relative to the detected each position indicator, and determine, based on a result of the detection, the current position of the reader.

The reader-position recognizing portion may be one, not in accordance with the twelfth mode (12), that includes a plurality of detectors which are respectively provided at a plurality of reference positions along the track in the guide and each of which detects a portion of the reader and produces a signal representing the detection of that portion, and that detects, based on the signal supplied from one of the detectors, a current position of the reader relative to a corresponding one of the reference positions, and determines, based on a result of the detection, a corresponding one of the reading positions. In contrast, according to this mode in which the position-indicator-related-position detecting portion is provided in the reader, the number of detectors employed can be minimized, and the information reading apparatus enjoys a simpler construction and a lower production cost.

(13) The component-supplying-device-related-information reading apparatus according to the mode (12), wherein the position-indicator-related-position detecting portion detects each one of the position indicators corresponding to the component supplying devices, respectively, and accordingly the reading-position determining device determines each one of the reading positions corresponding to the component supplying devices, respectively.

According to this mode, each of the position indicators can be associated with the component-supplying-device-related information read at a corresponding one of the reading positions. The position indicators correspond to the respective positions where the component supplying devices are provided. Therefore, for example, in the above-described case where the component supplying system is constructed such that the component supplying devices are provided at the respective predetermined positions, and it is needed to obtain information about which one of the component supplying devices, or which sort of component supplying device is provided at each of those predetermined positions, the information reading apparatus in accordance with the present mode is advantageous.

(14) The component-supplying-device-related-information reading apparatus according to any of the modes (9) through (13), further comprising a reading control device which controls the information reading portion to read, at said at least one reading position determined by the reading-position determining device, the component-supplying-device-related information related to said each of the component supplying devices.

According to this mode, for example, when the reader is positioned at one of the reading positions, the information reading portion may automatically read a set of component-supplying-device-related information. Thus, this mode is advantageously combined with the above-described mode (7) in which the reader scans the respective information indicators provided on the component supplying devices and thereby reads the respective sets of component-supplying-device-related information. Like the reading-position determining device, the reading control device may be configured such that an essential portion thereof is provided in either one of the guide and the reader, or is not provided in either of the reader and the guide.

(15) The component-supplying-device-related-information reading apparatus according to any of the modes (1) through (14), wherein the reader comprises a wireless transmitter which transmits, by wireless, the component-supplying-device-related information read by the reader.

Usually, the component-supplying-device-related information read by the information reading portion is converted into an electric signal, and the electric signal is sent to a system managing device that manages the component supplying system. According to the principle of the present invention, this signal may be sent from the reader via an electric wire. However, according to this mode, the read information is transmitted by a communications means employing, as a medium, infrared rays, visible rays, or other sorts of electromagnetic waves whose wavelengths are shorter than those of the infrared rays or the visible rays. Since no wires are needed, the reader can be easily operated, in particular, when the reader is moved with the human power as described above.

(16) The component-supplying-device-related-information reading apparatus according to any of the modes (1) through (15), further comprising a track-position-change permitting device which permits the track to be selectively changed to at least a first position to read the component-supplying-device-related information and to a second position not to read the component-supplying-device-related information.

Usually, the reading of the component-supplying-device-related information is carried out not during the component mounting operation but during a system resetting operation in which a current sort of production objects is changed to a new sort of production objects. Depending upon the portion of each component supplying device where the corresponding information indicator is provided, a component mounting operation performed by a mounting head may be interfered with by the portion of the guide that defines the track. The present mode is advantageous for this case. For example, the guide may be configured such that during the component mounting operation, a track-defining portion of the guide that defines the track is positioned at a retracted position where the track-defining portion does not interfere with the component mounting operation and, when the information reading operation is performed, the track-defining portion is moved from the retracted position to an operative position thereof for the reader to perform the information reading operation.

The track-position-change permitting device may be one that is provided in the guide such that the device permits the changing of positions of the track-defining portion of the guide, or one that is provided between the guide and the component supplying system (e.g., between the guide and a base portion of the component supplying system where the component supplying devices are provided) such that the device permits the changing of positions of the guide per se. The track-position-change permitting device may include a movement permitting portion that permits the track-defining portion or the guide per se to be moved along a predetermined path; and a position maintaining portion that maintains the position of the track-defining portion or the guide per se at each of predetermined or arbitrary positions on the path. The predetermined path may be a straight path, or a curved path (e.g., a path along a portion of a circle). However, the present mode is not limited to the manner in which the position of the track is changed between the above-described two positions only, but may be modified such that the position of the track is selectively changed to one or more additional positions other than the two positions.

(17) The component-supplying-device-related-information reading apparatus according to any of the modes (1) through (16), wherein the guide is separate from the component supplying system and is detachably attached to the component supplying system when the component-supplying-device-related information is read by the reader.

According to the present mode, the guide is detachably attached to the component supplying system. For example, in the case where there are a plurality of identical or similar component supplying systems, the single guide may be detached from one of the systems and be attached to each of the other supplying systems. In this case, the present information reading apparatus can be used commonly with the plurality of component supplying systems. Thus, the present reading apparatus is very convenient. More specifically described, the present reading apparatus may be configured such that each of the component supplying systems employs an engageable portion and the guide employs an engaging portion, and when the engageable portion is engaged by the engaging portion, the track defined by the guide is located at an appropriate position. Thus, it can be said that the present information reading apparatus employs a positioning device that positions the track. A device for detachably attaching the guide to the component supplying system may be a single-action-type device such as a magnet-using device.

BEST MODE FOR CARRYING OUT THE INVENTION

Hereinafter, one embodiment of the present invention will be described by reference to the drawings. For easier understanding purposes only, first, a component supplying system to which a component-supplying-device-related-information reading apparatus (hereinafter, abbreviated to "the reading apparatus", where appropriate) is applied is described, and then the reading apparatus is described. Here, it is noted that the present invention is not limited to the details of the following embodiments but may be embodied with various changes and improvements, such as those previously described in SUMMARY OF THE INVENTION, that may occur to a person skilled in the art.

Component Supplying System

Figure 1:
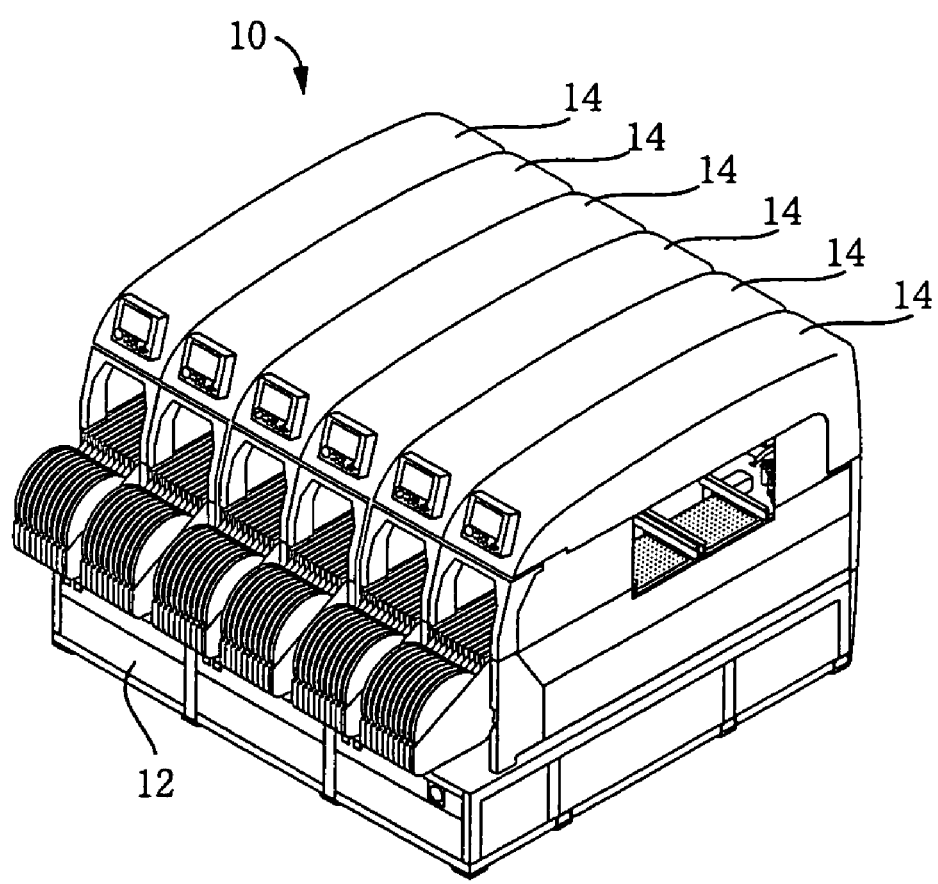
FIG. 1 is a perspective view of an entirety of a component mounting machine employing a component supplying system.
Figure 2:
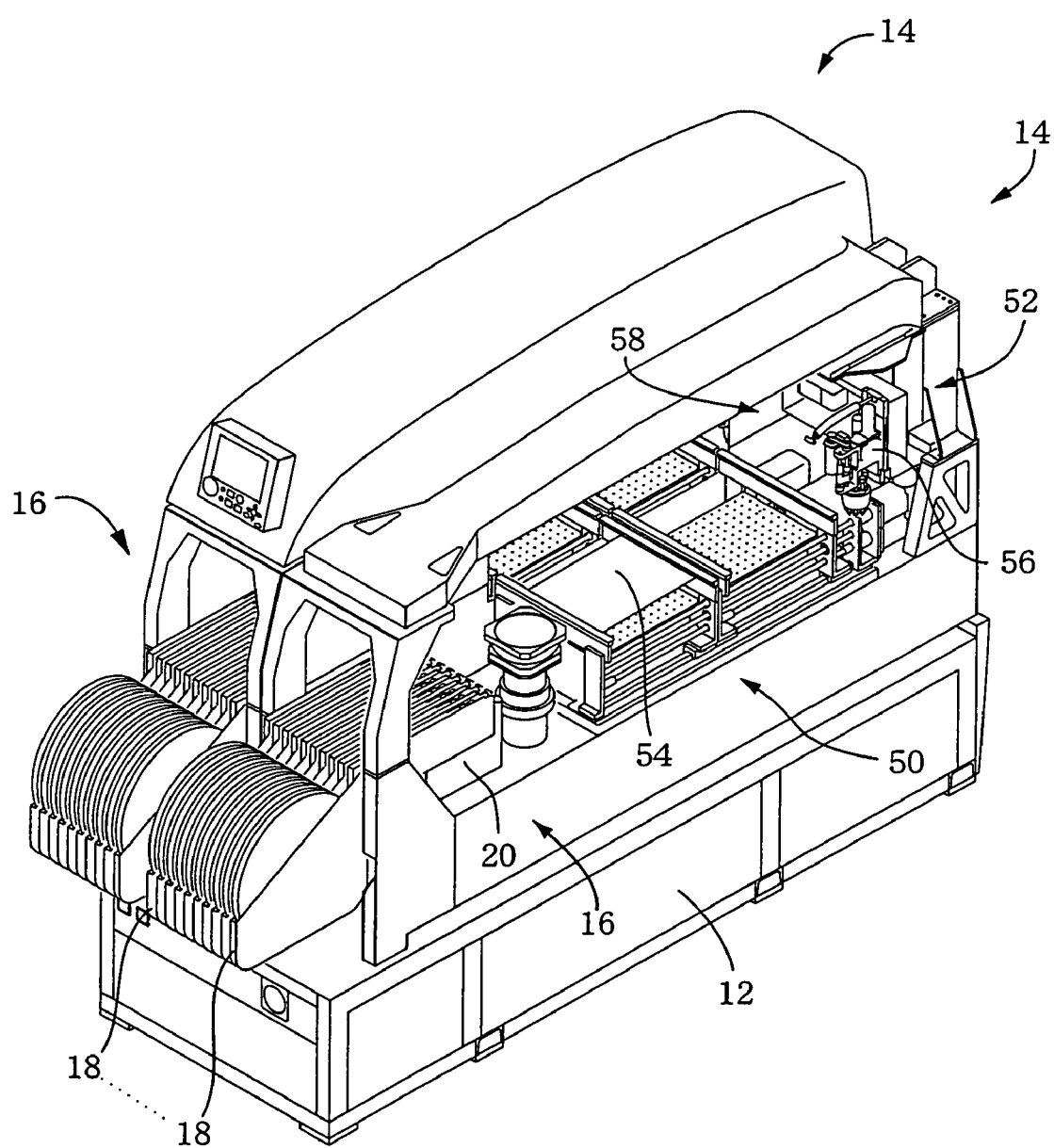
FIG. 2 is a perspective view showing an internal construction of a mounting module as part of the component mounting machine.

FIG. 1 is a perspective view of an entirety of a component mounting machine employing a component supplying system. The component mounting machine 10 includes a base module 12, and six mounting modules 14 that are provided on the base module 12 such that the mounting modules 14 are arranged in a circuit-substrate conveying direction. FIG. 2 is a perspective view showing an interior construction of each mounting module 14. However, FIG. 2 shows two mounting modules 14 only. Each of the six mounting modules 14 includes a component supplying system 16 exclusively used therefor. The component supplying system 16 includes a plurality of tape feeders 18 (hereinafter, abbreviated to "the feeders 18", where appropriate) each as a component supplying device, and a feeder table 20 as a base portion on which the feeders 18 are provided.

Figure 3:
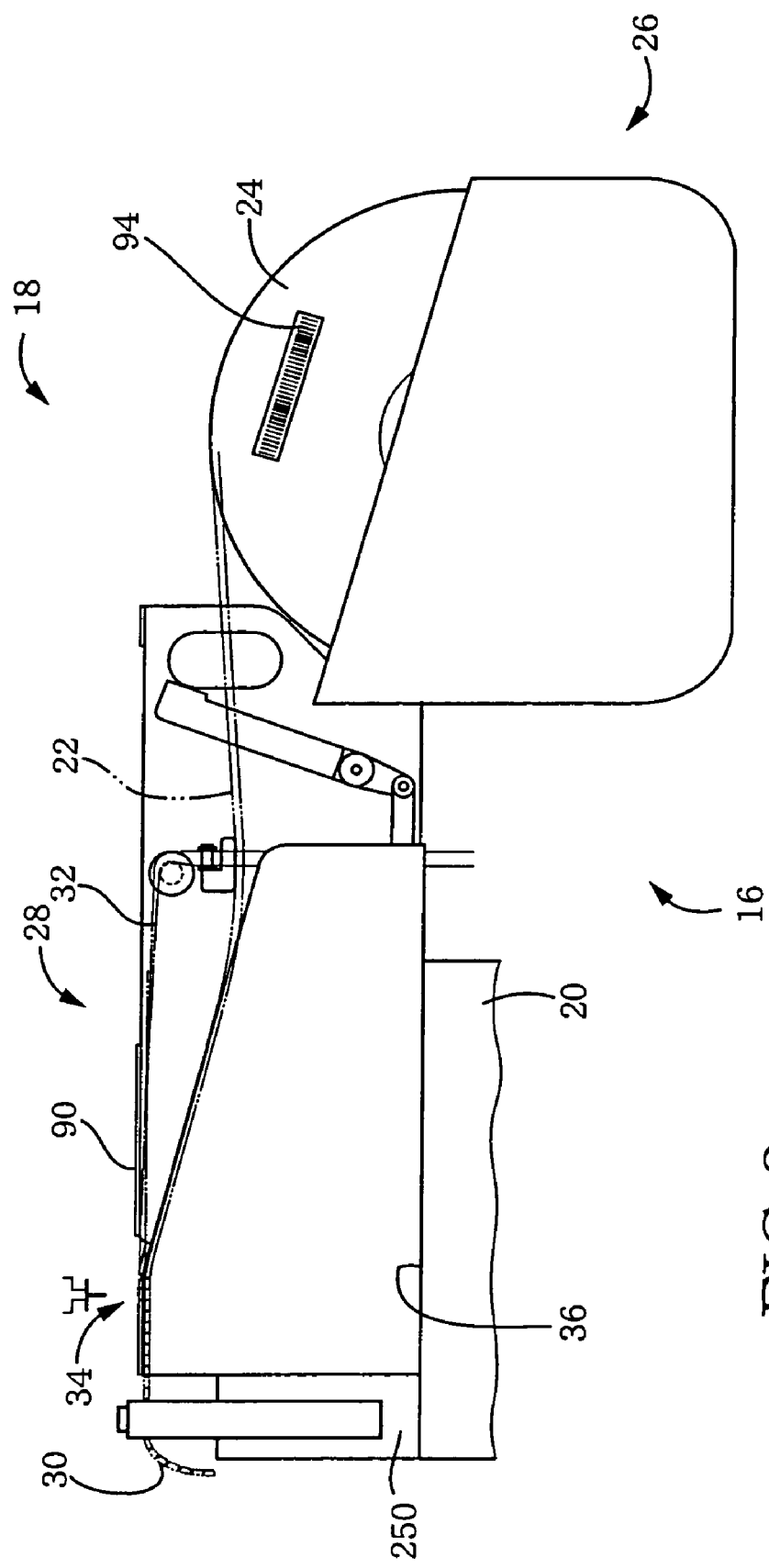
FIG. 3 is a side elevation view of the component supplying system.

FIG. 3 is a side view of the component supplying system 16 (as seen from a left and rear angle in FIG. 2). Each of the feeders 18 as the component supplying devices includes a reel holding portion 26 that holds a reel 24 around which an electronic-component tape 22 (hereinafter, abbreviated to "the component tape 22", where appropriate) is wound; and a tape feeding portion 28 that feeds a portion of the component tape 22 that is drawn from the reel 24, in a tape feeding direction (i.e., in a leftward direction in the figure). Since the component tape 22 is well known in the art, no detailed description thereof is provided here. In short, the component tape 22 is constituted by a carrier tape 30 that has, at a predetermined pitch, a plurality of pockets that accommodate respective electronic components; and a cover tape 32 that covers respective upper openings of the pockets. Since the feeder 18 is also well known in the art, no detailed description thereof is provided here. In short, the tape feeding portion 28 feeds the component tape 18 at a pitch equal to the component accommodating pitch, and peels the cover tape 32 off the carrier tape 30, at a component supplying position 34, so that the electronic components can be supplied, one by one, from the position 34. Each feeder 18 includes an electric motor (not shown) as a drive source and, when the electric motor is driven, the each feeder 18 feeds the component tape 22 and peels the cover tape 32 off the carrier tape 30.

The feeder table 20 has a support surface 36 that supports the feeders 18. The support surface 36 has a plurality of slots, not shown, that extend in a direction parallel to the tape feeding direction (i.e., in leftward and rightward directions in the figure). In a state in which the feeders 18 are engaged with the respective slots, the feeders 18 are arranged in an array on the feeder table 20. Since the slots are formed at a predetermined regular pitch, feeders 18 having a same width can be arranged at the regular pitch. Various sorts of feeders 18 having, e.g., different widths corresponding to different sorts of electronic components can be attached to the feeder table 20 (in the present embodiment, however, it is assumed that the feeders 18 having the same width are attached to the feeder table 20, for easier understanding). In addition, any of the feeders 18 can be attached to any of the slots of the feeder table 20.

The reel holding portion 26 of each feeder 18 can hold any of various sorts of standardized reels 24 around which various sorts of component tapes 22 are respectively wound. The current sort of electronic components that are supplied by each feeder 18 can be changed to a new sort of electronic components, by changing the current sort of reel 24 that is held by the reel holding portion 26, to a new sort of reel 24. Since various sorts of electronic components are mounted on various sorts of circuit substrates, a component mounting operation usually needs a plurality of sorts of reels 24 around which different sorts of components tapes 22 are wound. Thus, a plurality of feeders 18 holding respective reels 24 are provided in each of the respective component supplying systems 16 of the mounting modules 14. The feeders 18 provided in each of the component supplying systems 16, and the electronic components supplied by each of the feeders 18 are managed in a manner that will be detailed later.

Each of the mounting module 14 mounts, on a circuit substrate 54, a plurality of sorts of electronic components supplied by the plurality of feeders 18. As shown in FIG. 2, the each mounting module 14 includes, in addition to the component supplying system 16, a substrate conveying and holding device 50 and a component mounting device 52. Since those devices 50, 52 are not relevant to the present invention, no detailed description thereof is provided here. In short, the substrate conveying and holding device 50 that is essentially constituted by a conveyor, cooperates with the respective substrate conveying and holding devices 50 of other mounting modules 14 located adjacent to the each mounting module 14, to convey the circuit substrate 54, and fixes and holds the circuit substrate 54 at a predetermined, operation performing position. The component mounting device 52 includes a mounting head 56, and an XY-robot-type moving device 58 that moves the mounting head 56 on a plane parallel to the circuit substrate 54. The mounting head 56 supports a plurality of mounting units each of which is vertically movable and includes a suction nozzle that can hold, at a lower end thereof, an electronic component. The mounting head 56 is reciprocated, by the moving device 58, between the component supplying system 16, and the circuit substrate 54 fixed and held at the operation performing position, while the mounting head 56 takes and holds electronic components from appropriate feeders 18 of the component supplying system 16, and mounts the components held thereby, on appropriate positions on the circuit substrate 54.

Figure 4:
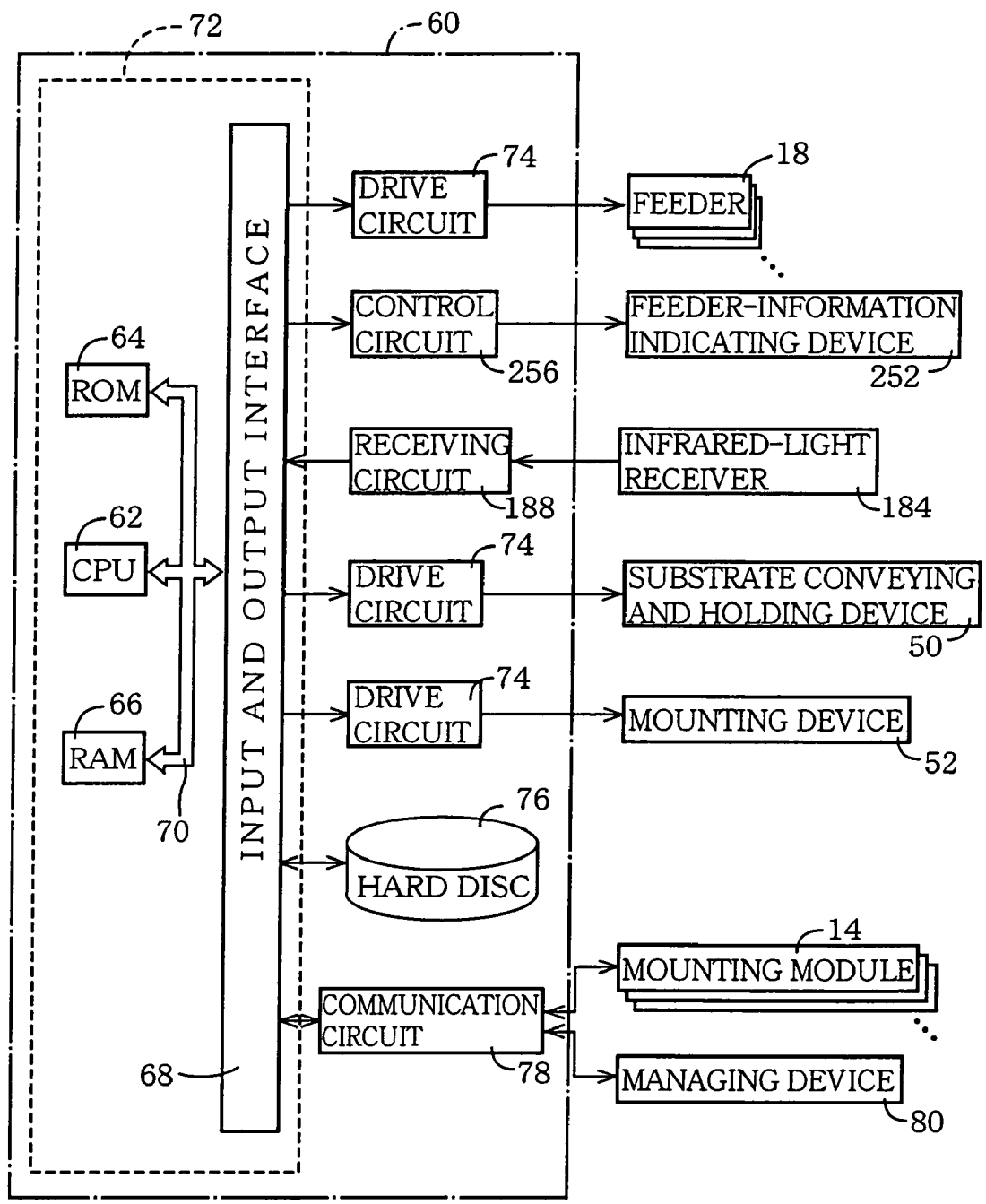
FIG. 4 is a diagrammatic view of a module control device that controls the mounting module.

Each mounting module 14 includes a module control device 60 that controls the each mounting module 14 per se. FIG. 4 is a diagrammatic view of the module control device 60. The module control device 60 is essentially constituted by a computer 72 including a CPU 62, a ROM 64, a RAM 66, an input and output interface 68, and a bus 70 for connecting those elements 62, 64, 66, 68 to each other. To the input and output interface 68, the feeders 18, the substrate conveying and holding device 50, and the component mounting device 52 are connected via respective drive circuits 74. Thus, the respective tape feeding portions 28 of the feeders 18 are controlled by the module control device 60. More strictly described, the component supplying system 16 includes a portion of the module control device 60 that controls the feeders 18. In addition, to the input and output interface 68, a hard disc 76 as an external memory device is connected, and the other mounting modules 14 and a managing device 80 that is essentially constituted by a computer and functions like a host computer are connected via a communication circuit 78 (e.g., a LAN). Other elements that are connected to the input and output interface 68 will be described later.

Each mounting module 14 performs a component mounting operation according to a component mounting program corresponding to a sort of a circuit substrate 54 as an object. The component mounting program is sent by the managing device 80, and is stored by the hard disc 76. When each mounting module 14 performs the component mounting operation, the component mounting program is read from the hard disc 76 to the RAM 66. The component mounting program is constituted by an operating program that is related to respective operations of the constituent devices of the each mounting module 14, and feeder data that are related to the feeders 18. Here, only a relevant portion of the component mounting program is explained. The operating program includes operation commands. For example, the operation commands include a command to operate an arbitrary feeder 18, located at a certain position or slot (hereinafter, referred to "a Slot No.", where appropriate), to feed a component tape 22; and a command to operate the mounting head 56 to take an electronic component from an arbitrary feeder 18 located at a certain slot having a Slot No. and mount the component at a certain position on the circuit substrate 54. The feeder data are data that are associated with Slot Nos., and include data (i.e., slot-feeder data) representing respective types of feeders 18 that are to be located at respective slots having respective Slot Nos., and data (i.e., slot-component data) representing sorts of electronic components that are to be supplied by respective feeders 18 located at respective slots having respective Slot Nos.

The component mounting operation is performed according to the above-described component mounting program. Therefore, if a feeder 18, located at a slot having a pre-programmed. Slot No. is not of an appropriate type, or if a feeder 18, located at a slot having a pre-programmed Slot No., is not one that supplies an appropriate sort of electronic components, then a trouble may occur. For example, the mounting module 14 may not perform the component mounting operation, or the circuit substrate 54 on which the electronic components are mounted may be defective. Thus, it is important to manage the feeders 18 provided in each mounting module 14 and the electronic components supplied by those feeders 18.

Figure 5:
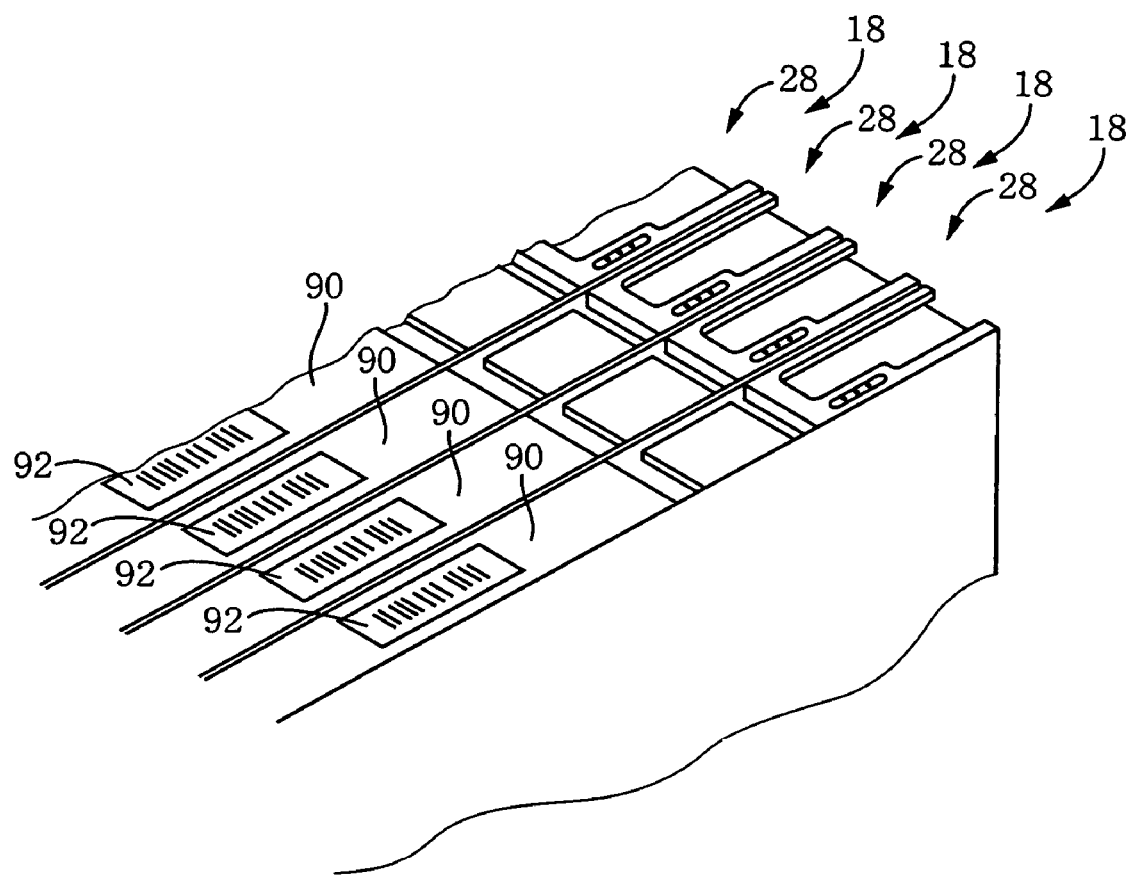
FIG. 5 is a perspective view showing a plurality of feeders arranged in an array.

In the component supplying system 16, the management of the feeders 18 and the management of the electronic components to be supplied are carried out based on a feeder ID as individual identification information of each feeder 18. FIG. 5 is a perspective view of respective portions of the feeders 18 that are arranged in the array on the feeder table 20. Each of the feeders 18 has a bar-code label 92 (hereinafter, referred to as "the bar code 92", where appropriate) on which a bar code is printed and which is adhered to a top member 90 (see FIG. 3) of the tape feeding portion 28. The bar code 92 functions as an information indicator that indicates the feeder ID as a set of component-supplying-device-related information. As will be detailed later, the respective bar codes 92 of the feeders 18 arranged on the feeder table 20 are read by a reading device, and the respective feeder IDs indicated by the thus read bar codes 92 are stored as arranged-feeder information in the RAM 66 of the module control device 60 such that the respective feeder IDs are associated with the respective Slot Nos. of the slots with which the feeders 18 are engaged. Thus, the arranged-feeder information including the sets of component-supplying-device-related information is obtained by the module control device 60.

Each feeder ID includes a portion indicating a type of the corresponding feeder 18. Thus, the module control device 60 compares the thus obtained arranged-feeder information with the previously-described slot-feeder data contained by the component mounting program, and judges whether appropriate types of feeders 18 are located at respective appropriate slots.

A reel setting operation to set a reel 24 to the reel holding portion 26 of each feeder 18 is performed at a place remote from the component mounting machine 10 (for easier understanding, it is assumed in the present embodiment that the reel setting operation is not performed by the component mounting machine 10 per se). In the reel setting operation, the feeders 18 are associated with the respective sorts of electronic components to be supplied thereby, as follows: Each reel 24 has a reel bar code 94 indicating a sort of electronic components carried by a component tape 22 wound around the each reel 24 (more specifically described, a label (see FIG. 3) on which the reel bar code 94 is printed is adhered to the each reel 24). In the reel setting operation, the reel bar code 94 of the each reel 24 and the bar code 92 of the feeder 18 on which the each reel 24 is set are read by a bar-code reader, and the thus read bar codes 92, 94 are stored in the above-described managing device 80.

When the feeder IDs are read as the arranged-feeder information in each of the mounting modules 14 as described above, the module control device 60 communicates with the managing device 80 and recognizes, by using the feeder IDs as keys, the respective sorts of electronic components to be actually supplied by the feeders 18 arranged on the feeder table 20. Since the feeder IDs are associated with the Slot Nos., the module control device 60 can recognize the respective sorts of electronic components to be actually supplied by the feeders 18 located at the respective slots having the respective Slot Nos. Thus, the module control device 60 compares the recognized sorts of electronic components, with the previously-described slot-component data contained by the component mounting program, and judges whether appropriate sorts of electronic components are to be supplied by the feeders 18 located at the respective slots having the respective Slot Nos.

Thus, the management of the feeders 18 arranged on the feeder table 20 and the management of the electronic components to be supplied by those feeders 18 are carried out by the module control device 60 of each mounting module 14. That is, the module control device 60 can also function as a system managing device that manages the component supplying system 16.

Construction of Component-Supplying-Device-Related-Information Reading Device

As described above, the arranged-feeder information, i.e., the respective feeder IDs of the feeders 18 arranged on the feeder table 20 are obtained by reading the respective bar codes 92 affixed as the respective information indicators to the feeders 18. Hereinafter, there will be described a construction of a reading device 100 that reads the respective bar codes 92 of the feeders 18.

Figure 6:
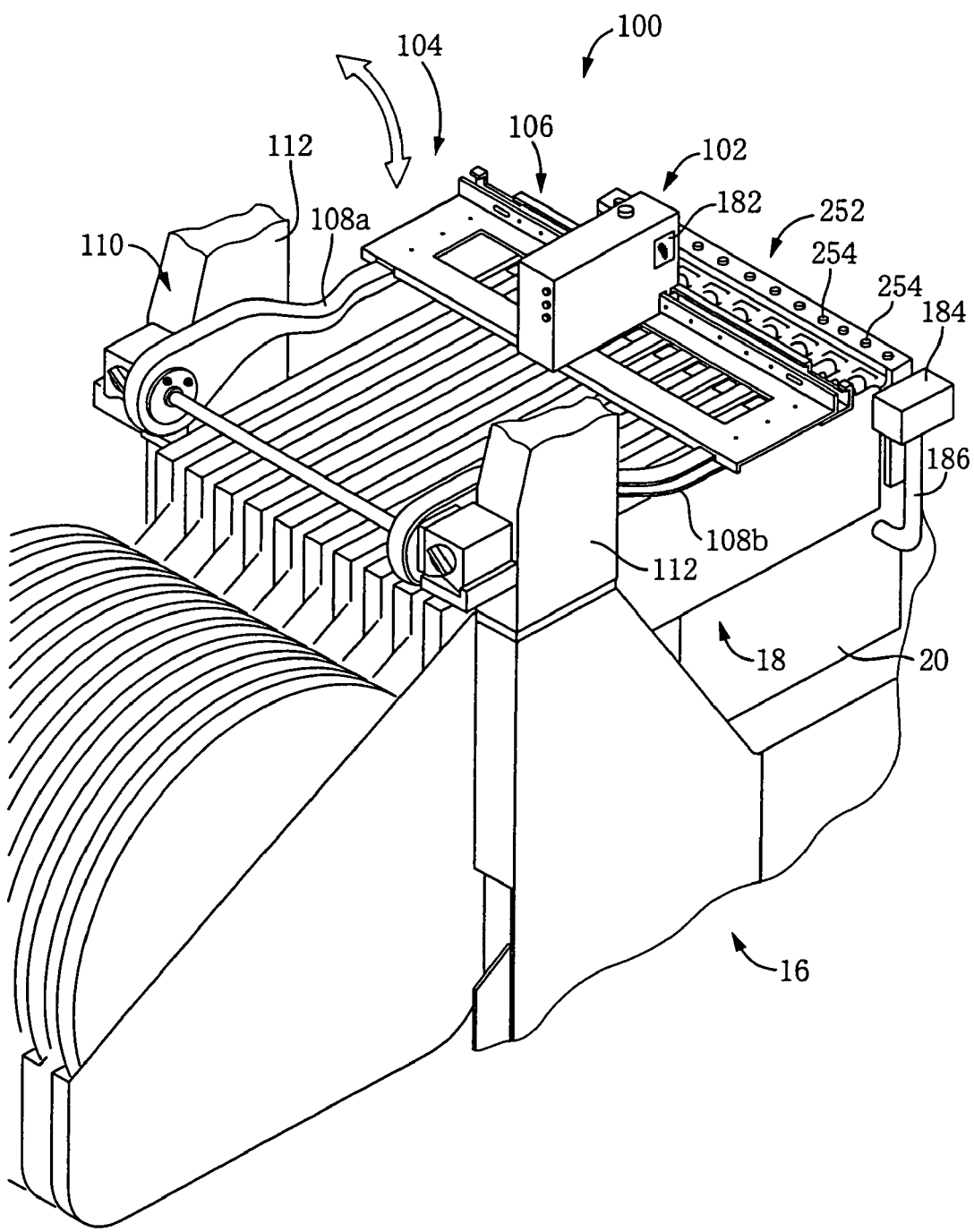
FIG. 6 is a perspective view showing a state in which a component-supplying-device-related-information reading apparatus is used in the component supplying system.

FIG. 6 is a perspective view showing a state in which the reading device 100 is in use with the component supplying system 16. The reading device 100 includes a reading unit 102 including a bar-code reader 150, and a guide unit 104 that guides the reading unit 102 in the direction in which the feeders 18 are arranged. The guide unit 104 is essentially constituted by a guide portion 106 that defines a track along which the reading unit 102 is moved; and a base portion 110 that includes two arms 108a, 108b (hereinafter, referred to as "the arms 108", where appropriate) and supports the guide portion 106. The guide unit 104 is attached to each mounting module 14, such that the base portion 110 of the guide member 104 is secured to columns 112 of the each mounting module 14. Thus, the guide unit 104 is attached to the component supplying system 16 of the each mounting module 14. FIG. 6 shows a state in which the guide portion 106 is held at a predetermined operative position thereof where the reading unit 102 can read the respective bar codes 92 of the feeders 18, and the reading unit 102 is engaged with the guide unit 104. In this state, the reading unit 102 is movable, in the direction in which the feeders 18 are arranged, within a range larger than a range (hereinafter, referred to as "the necessary movement range", where appropriate) in which the reading unit 102 can read the respective bar codes 92 of all the feeders 18 that are respectively engaged with all the slots of the feeder table 20.

Figure 7:
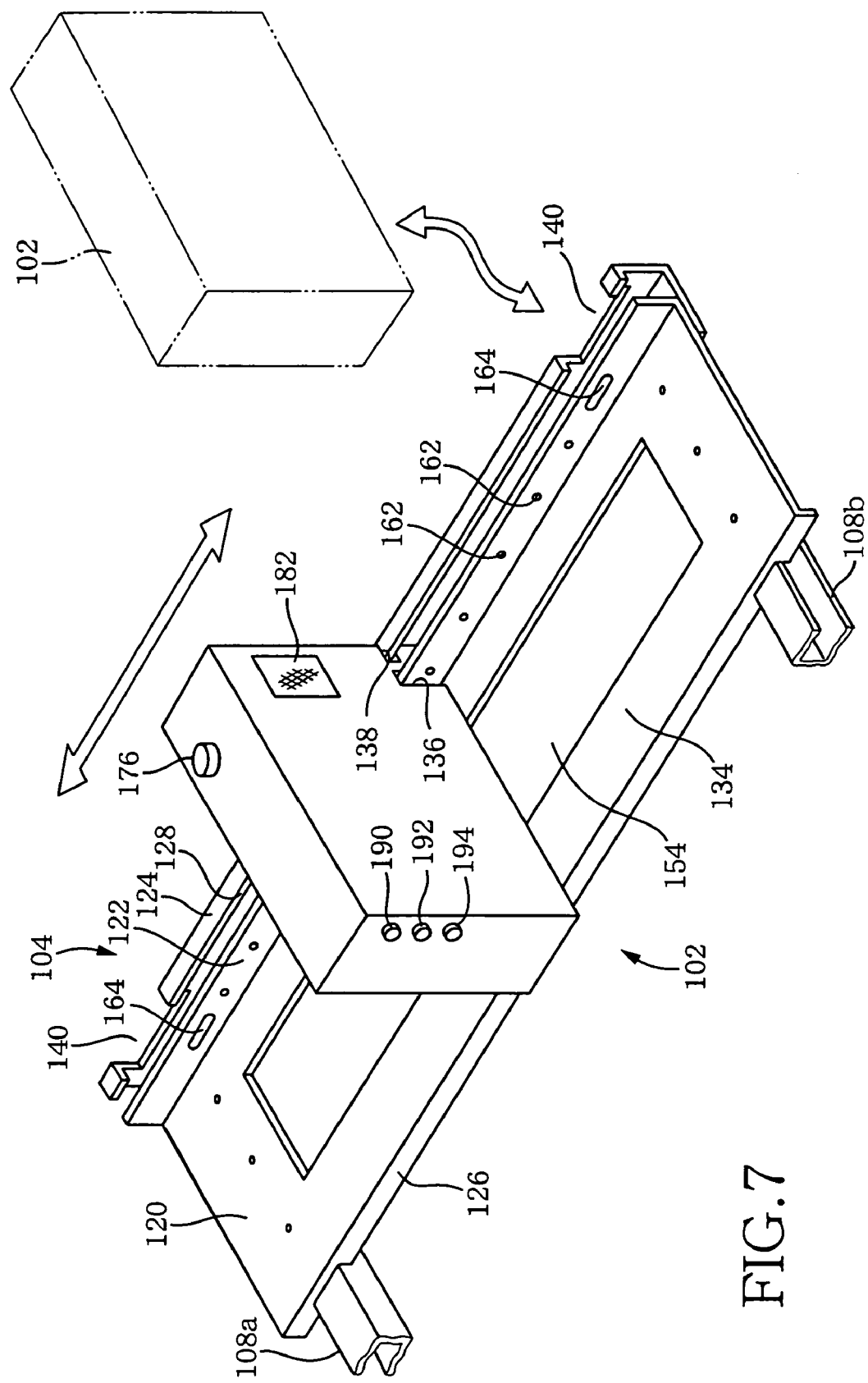
FIG. 7 is a perspective view of a portion of the reading apparatus, showing a state in which a reading unit is engaged with a guide portion of a guide unit.
Figure 8:
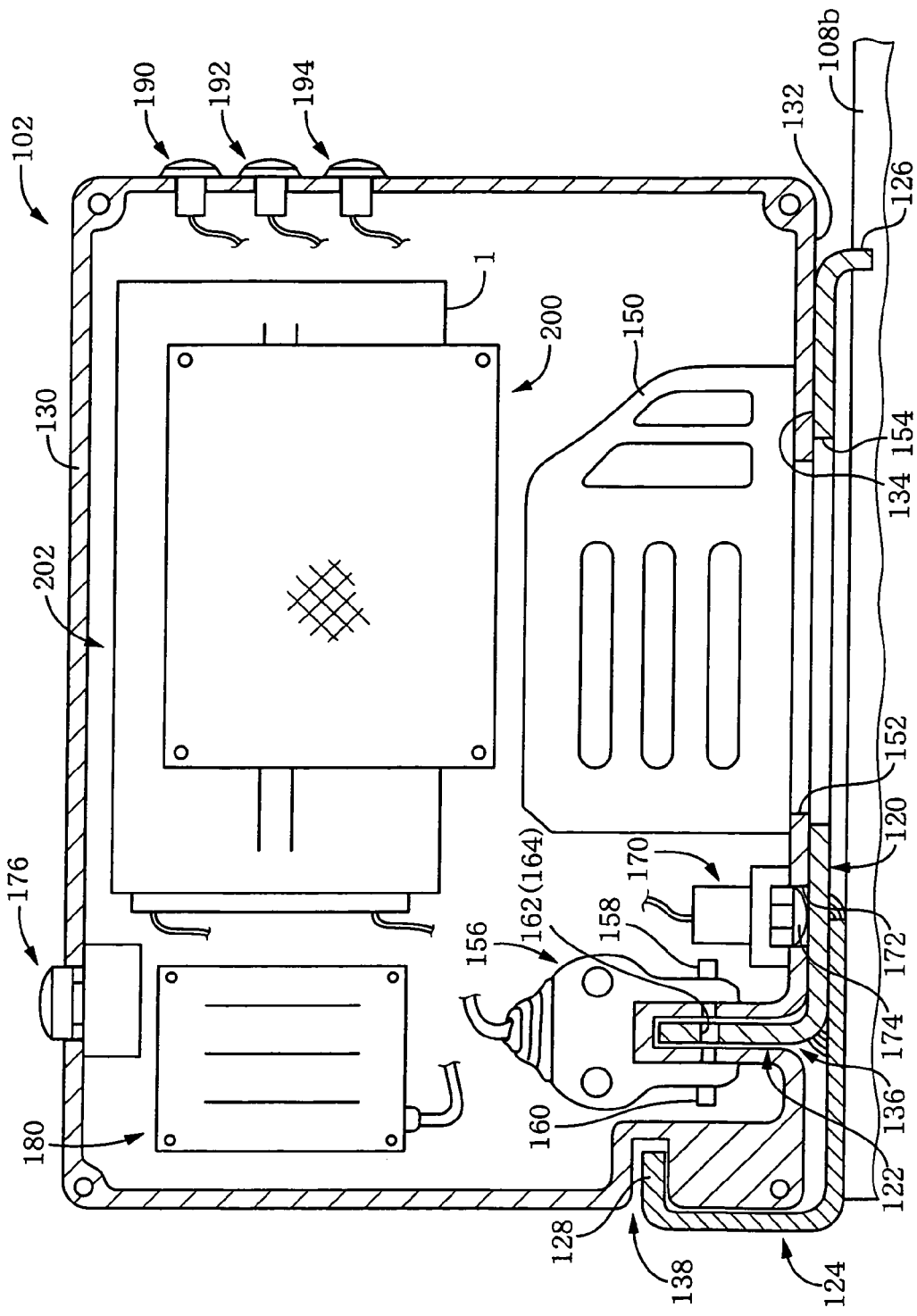
FIG. 8 is a view showing an internal construction of the reading unit as a portion of the reading apparatus.

FIG. 7 is a perspective view showing a portion of the reading device 100 in the state in which the reading unit 102 is engaged with the guide portion 106 of the guide unit 104; and FIG. 8 shows an internal construction of the reading unit 102. FIG. 8 is a cross-section view as seen from a left and rear angle in FIG. 7. The reading unit 102 has a generally box-like shape, and is detachably attached to the guide unit 104. When the reading device 100 is not used, the reading unit 102 is kept away from the guide unit 104. Meanwhile, when the bar codes 92 are read, the reading unit 102 is attached to the guide unit 104 by being engaged with the guide portion 106 thereof. The guide portion 106 is generally constituted by the following three portions; the first portion is a support portion 120 that mainly supports the reading unit 102, the second portion is a rail portion 122 that mainly defines the direction of movement of the reading unit 102, and the third portion is an engaging portion 124 that mainly prevents the reading unit 102 from being disengaged, during an information reading operation thereof, from the guide portion 106. The support portion 120 and the rail portion 122 are formed integrally with each other, such that the rail portion 122 stands upright on the support portion 120. The support portion 120 has, in one end portion thereof opposite to the rail portion 122, a flange 126 as a reinforcing portion. The engaging portion 124 has a generally J-shaped cross section, and is fixed to the support portion 120 such that a wide flange portion of the preventing portion 124 is connected to the other end portion of the support portion 120. A narrow flange portion (hereinafter, referred to as "the lip 128") of the engaging portion 124 can engage the reading unit 102.

The reading unit 102 includes a case 130, and various elements accommodated in the case 130. The case 130 has a flat lower surface providing a supported surface 132 that is contacted with, and supported by, a support surface 134 provided by an upper surface of the support portion 120. In the state in which the supported surface 132 and the support surface 134 are held in contact with each other, the reading unit 102 is moved on the support portion 120. The case 130 has, in a bottom portion thereof, a main groove 136 in which the rail portion 122 fits. In the state in which the rail portion 122 fits in the main groove 136, the direction of movement of the reading unit 102 is defined, and the change (i.e., rotation) of posture of the unit 102 on a plane parallel to the support surface 134 is prevented. In addition, the case 130 has, in a narrow side surface thereof, an auxiliary groove 138 into which the lip 128 of the engaging portion 124 projects. In the state in which the lip 128 projects into the auxiliary groove 138, the reading unit 102 is prevented from being disengaged from the guide portion 106. The support portion 120, the rail portion 122, and the engaging portion 124 cooperate with each other to function as a track-defining member that defines the track for the reading unit 102. Since the reading unit 102 includes the engaging portions 132, 136, 138 that can engage the track-defining member 120, 122, 124, the reading unit 102 is caused to move in only forward and backward directions along the track.

The reading unit 102 can be attached to, and detached from, the guide portion 106, at predetermined positions only. The engaging portion 124 has two recesses 140 in respective vicinities of opposite end portions thereof in the direction of extension of the track. The two recesses 140 are formed in the lip 128 of the engaging portion 124. Each recess 140 has a width somewhat larger than that of the reading unit 102, i.e., the case 130. Through each of the recesses 140, the reading unit 102 can be attached downward to, and detached upward from, the guide portion 106. Thus, the respective positions where the two recesses 140 are formed are the predetermined positions at each of which the reading unit 102 can be attached to, and detached from, the guide portion 106.

The reading unit 102 includes various elements accommodated in the case 130, and one of those elements is the bar-code reader 150 functioning as an information reading portion of the reading unit 102. The case 130 has, in a bottom wall thereof, a reading window 152 through which the bar-code reader 150 can read a bar code 92 of a feeder 18 that is located below the support portion 120. Since the support portion 120 has an opening 154 extending along the track, the bar-code reader 150 can read, through the opening 154, a bar code 92 anywhere within the above-described necessary movement range.

Figure 10:
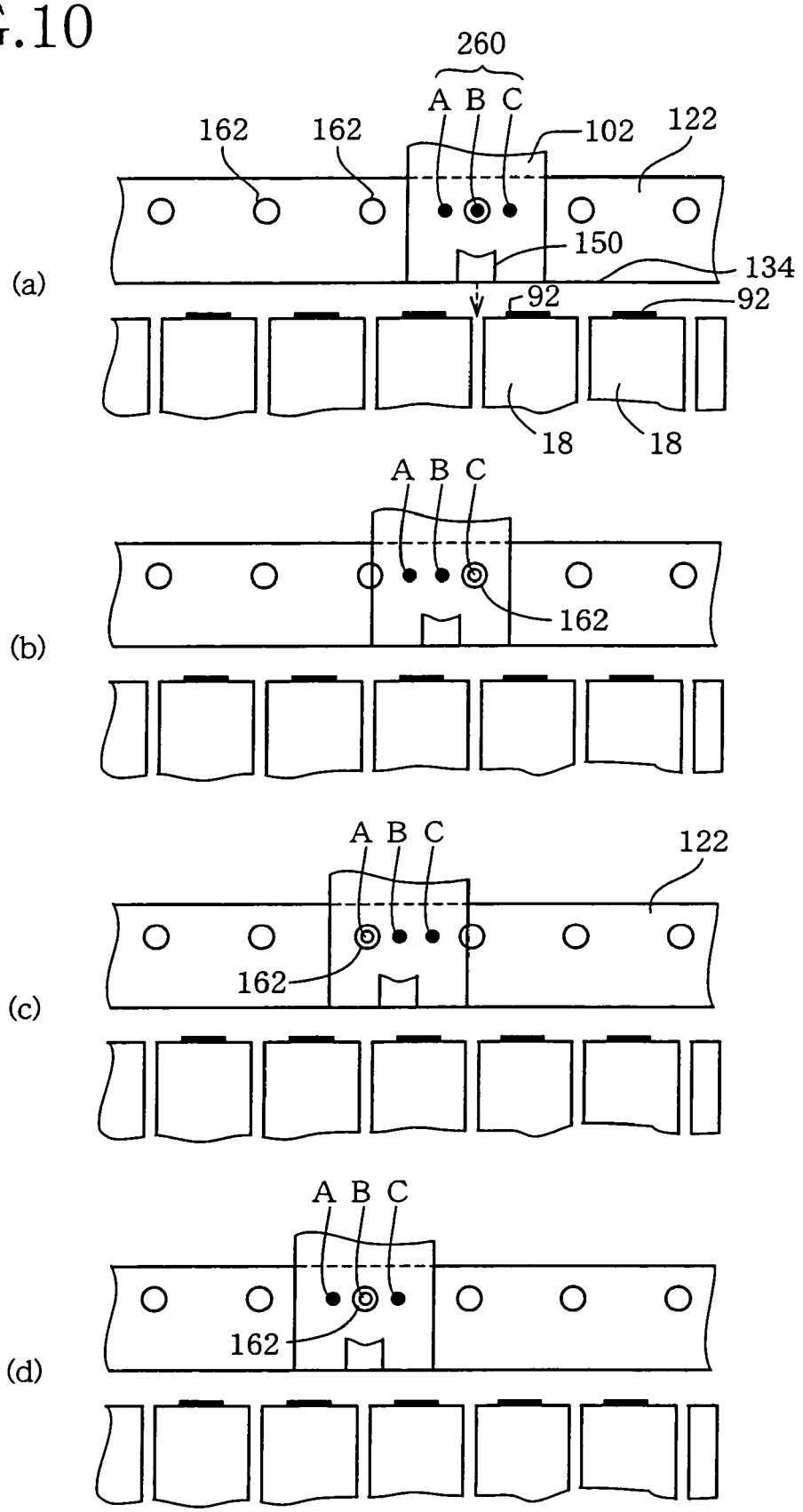
FIG. 10 is an illustrative view for explaining a relationship between a position of the reading unit on a track and a reading position where the reading unit reads a bar code of a feeder.

The reading unit 102 additionally includes a position detector 156 that detects a current position of the reading unit 102 per se so that a reading position can be determined, and a reading direction can be recognized, within the range of movement of the bar-code reader 150 along the track. The position detector 156 includes three photoswitches 260 (FIG. 10) arranged in an array. Each of the photoswitches 260 includes an LED 158 as a light source, and a phototransistor 160 that is opposed to the LED 158 via the main groove 136 and detects a light emitted by the same 158. In the state in which the reading unit 102 is engaged with the guide portion 106, the three photoswitches 260 are arranged in a direction parallel to the track. The rail portion 122 has, along the track, a plurality of through-holes 162, 164 each of which permits the light emitted by the LED 158 to pass therethrough. Wherever the reading unit 102 may be positioned, at least one of the three photoswitches 260 is placed in an ON state thereof in which the same 260 detects the light through at least one of the through-holes 162, 164. Those through-holes include two sorts, i.e., position-indicating holes 162 and start-and-end-indicating holes 164. The position-indicating holes 162 are formed at the same pitch as the pitch at which the feeders 18 are arranged on the feeder table 20, and indicate respective positions where the feeders 18 are located. Each of the position-indicating holes 162 has dimensions that can turn on, at one time, only one of the three photoswitches 260 of the reading unit 102. The start-and-end-indicating holes 164 are two holes that are formed in respective vicinities of opposite ends of the range of movement of the reading unit 102, and indicate respective positions where the reading unit 102 starts and ends a reading movement. Each of the start-and-end-indicating holes 164 is an elongate hole that can simultaneously turn on all the three photoswitches 260 of the reading unit 102. Since the position detector 156 detects the position indicators, the position detector 156 can be said as a position-indicator detector. The manner in which the reading position is determined and the reading direction is recognized will be detailed later. In the following description, the position-indicating holes 162 and the start-and-end-indicating holes 164 may be abbreviated to "the holes 162" and "the holes 164", where appropriate.

The reading unit 102 additionally includes two switches, i.e., an appropriate-engagement detecting switch 170 and a reading-movement starting switch 176. The appropriate-engagement detecting switch 170 detects a state in which the reading unit 102 is appropriately engaged with the guide portion 106. This switch 170 is provided in a switch receiving hole 172 formed in the bottom wall of the case 130, such that a detecting end portion 174 of the switch 170 projects beyond the supported surface 132. In the state in which the supported surface 132 is appropriately contacted with the support surface 134, the detecting end portion 174 is pushed into the hole 174, so that the switch 170 is turned on. The reading-movement starting switch 176 is a push-button-type switch that is provided in a top wall of the case 130. The manner in which this switch 176 is used will be described later.

Moreover, the reading unit 102 includes an infrared-light transmitter 180 as a wireless transmitter that transmits information, i.e., the respective feeder IDs of the feeders 18 that are read by the bar-code reader 150. The infrared-light transmitter 180 transmits the information through a transmission window 182 provided in a side wall of the case 130. The feeder IDs transmitted by the infrared-light transmitter 180 are received by an infrared-light receiver 184. As shown in FIG. 6, the infrared-light receiver 184 is supported by a bracket 186 that extends upward from a side wall of the feeder table 20 of the component supplying system 16, such that in the state in which the guide portion 106 is held at the operative position thereof the transmission window 182 of the reading unit 102, engaged with the guide portion 106, is opposed to a receiving portion of the receiver 184. As illustrated in the diagrammatic view of FIG. 4, the infrared-light receiver 184 is connected to the input and output interface 68 of the computer 72 of the module control device 60, via a receiving circuit 188 employed by the control device 60.

In addition, the reading unit 102 has, on one side wall of the case 130, three indicator lamps 190, 192, 194 that are arranged in an array in a vertical direction. The top lamp is a "power" lamp 190 that is turned ON when a "power" switch, not shown, of the reading unit 102 is turned ON; the intermediate lamp is a "stand-by" lamp 192 that is turned ON to indicate that the reading unit 102 is ready for the reading movement, when the above-described appropriate-engagement detecting switch 170 is in the ON state, i.e., when the reading unit 102 is appropriately engaged with the guide portion 106; and the bottom lamp is a "reading-movement" lamp 194 that is continuously turned ON from a time when the reading-movement starting switch 176 is pushed, to a time when the reading movement is ended.

Moreover, the reading unit 102 includes a controller 200 that controls the above-described various elements 150, 156, 170, 176, 180, 190, 192, 194 of the reading unit 102. The controller 200 is essentially constituted by a microcomputer to which the various elements of the reading unit 102 are connected and which includes a memory for storing control programs and controls, according to the control programs, those elements to thereby control the operation of the reading unit 102 as a whole. In addition, the reading unit 102 employs a rechargeable battery 202 as a power source for those elements. Since the reading unit 102 is not connected to the component supplying system 16 and can be detached from the guide unit 104, the reading unit 102 is made portable and is reduced in size.

Figure 9:
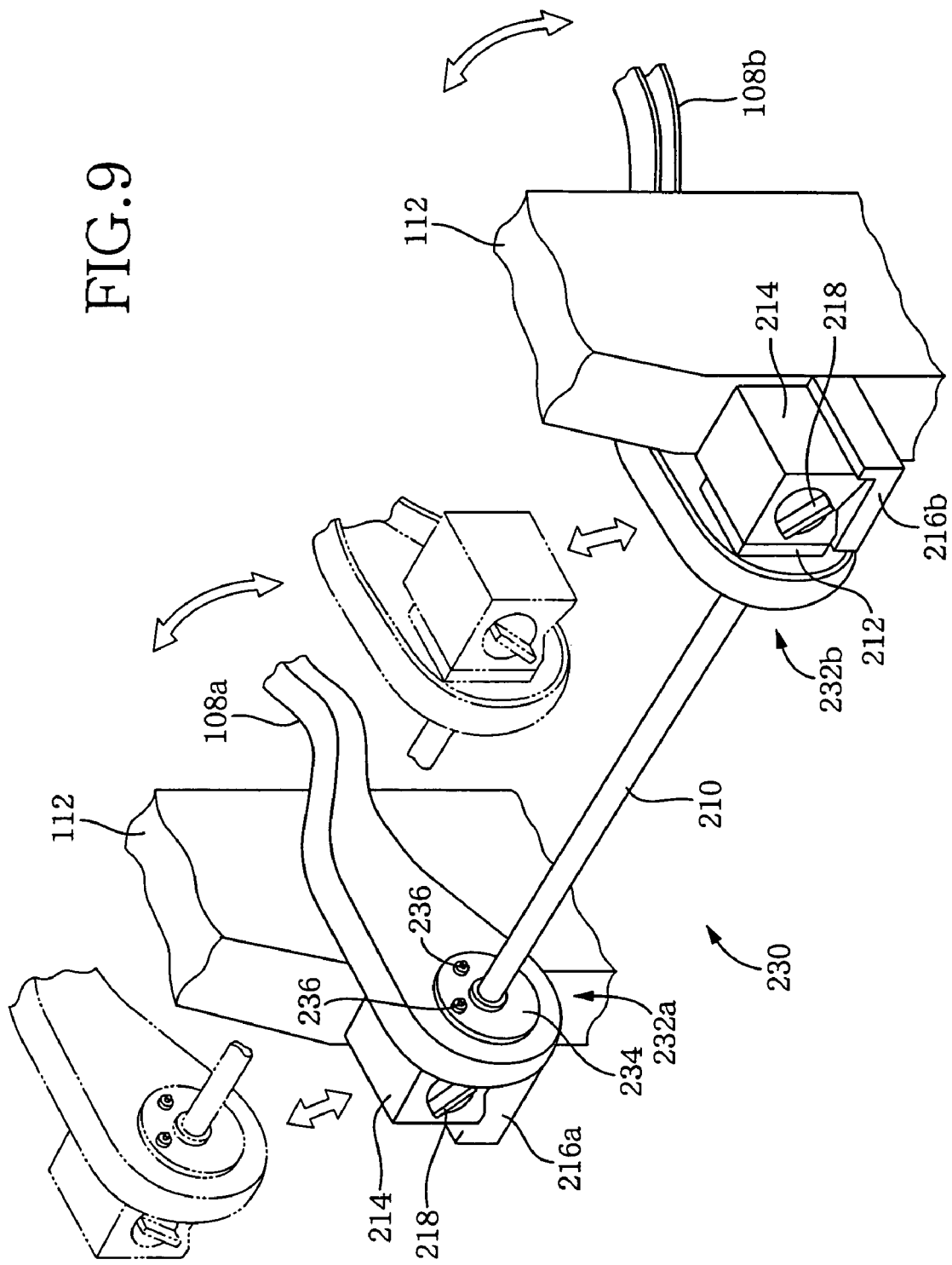
FIG. 9 is a perspective view of a support portion of the guide unit as another portion of the reading apparatus.

FIG. 9 is a perspective view of the base portion 110 of the guide unit 104. The base portion 110 includes the two arms 108a, 108b that are fixed, at respective one ends thereof, to a lower portion of the support portion 120 of the guide portion 106 (see FIGS. 6 through 9). Though not described in detail, respective other ends of the two arms 108a, 108b are supported by a support shaft 210, such that the arms 108 are rotatable relative to the shaft 210 and are not movable relative to the shaft 210 in an axial direction thereof. Two opposite ends of the support shaft 210 are fixed to two magnet blocks 214, respectively, each via a shaft fixing member 212.

The guide unit 104 is attached, by the two magnet blocks 214, to the two columns 112 of each mounting module 14, respectively. More specifically described, two brackets 216a, 216b that respectively support the two magnet blocks 214 while defining respective positions where the two magnetic blocks 214 are respectively attached to the two columns 112, are respectively fixed to the two columns 112, and the two magnetic blocks 214 are respectively attached to the two columns 112 while being respectively engaged with the two brackets 216a, 216b. Each of the two magnet blocks 214 includes a lever 218 that can be turned to control production of a magnetic force. Thus, as shown in FIG. 9, the guide unit 104 can be selectively attached to, and detached from, the columns 112, by operating the respective levers 218 of the two magnetic blocks 214. Thus, the magnetic blocks 214 of the guide unit 104 constitute first attachment portions of the unit 104; and respective portions of the columns 112 and the brackets 216a, 216b cooperate with each other to constitute second attachment portions of the component supplying system 16. The two brackets 216a, 216b are employed by each of the mounting modules 14. Therefore, the guide unit 104 can be detached from one of the mounting modules 14, and can be attached to each of the other mounting modules 14, under the same condition as the condition under which the guide unit 104 is attached to the one mounting module 14.

The guide unit 104 is constructed such that in the state in which the unit 104 is attached to each mounting module 14, the position of the guide portion 106, i.e., the position of the track defined by the guide portion 106 in the component supplying system 16 is changeable. More specifically described, the guide unit 104 has, as a track-position-change permitting device, a guide-portion-position-change permitting device 230 at respective portions where the two arms 108a, 108b are connected to the support shaft 210. The guide-portion-position-change permitting device 230 is constituted by two portions 232a, 232b corresponding to the two arms 108a, 108b, respectively. Though not described in detail, each of the two portions 232a, 232b includes a stationary disc 234 fixed to the support shaft 210, and two ball plungers 236 that are supported by the stationary disc 234 on a circle whose center rides on the support shaft 210. Each of the ball plungers 236 includes a ball and a spring that presses, at one end thereof, the ball against a side surface of the corresponding arm 108, more specifically described, into engagement with an engaging hole formed in the side surface, so that the arm 108 cannot be rotated with a small force. FIG. 9 (and FIG. 6 as well) shows the operative position of the guide portion 106 in which the ball of one of the ball plungers 236 is engaged with one of two engaging holes of each arm 108. If, from this state, the two arms 108 are rotated, with a considerably great force, in an upward direction about the support shaft 210, then the other ball plunger 236 is engaged with the other engaging hole of each arm 108, so that the guide portion 106 can be held at a different position lifted up from the operative position, i.e. a retracted position where the guide portion 106 does not interfere with the movements of the mounting head 56 during the component mounting operation. The two portions 232a, 232b of the guide-portion-position-change permitting device 230 additionally include respective limit-position stoppers, not shown, that cooperate with each other to prevent the guide portion 106 from being rotated in a downward direction beyond the operative position. Since the guide-portion-position-change permitting device 230 is constructed as described above, the permitting device 230 can be said as one that includes movement permitting portions that permit respective pivotal movements of the arms 108 and thereby permit a change of position of the track, and position fixing portions that stop the respective pivotal movements of the arms 108 and thereby fix the position of the track.

In addition to the reading device 100 constructed as described above, the component supplying system 16 further includes a feeder-information indicating device 252 that will be described below by reference to FIG. 6. The feeder table 20 has, in one end portion thereof as seen in the tape feeding direction, a front wall portion 250 having a feeder holding function (see FIG. 3), and the feeder-information indicating device 252 is supported by an upper portion of the front wall portion 250. The feeder-information indicating device 252 includes a plurality of LEDs 254 as indicator lamps that are arranged, along a reference line, at respective positions corresponding to the respective positions where the feeders 18 are located, i.e., the respective positions of the slots. A total number of the LEDs 254 is equal to that of the slots. The feeder-information indicating device 252 can indicate various sorts of status information that are related to each of the feeders 18. Here, only the functions of the indicating device 252 that are related to the present invention are explained: If an appropriate feeder 18 is placed and appropriate electronic components are supplied by the feeder 18, then the LED 254 corresponding to the position where the feeder 18 is located emits a green light; and if an appropriate feeder 18 is not placed or appropriate electronic components are not supplied by the feeder 18, then the LED 254 emits a red light. As illustrated in the diagrammatic view of FIG. 4, the feeder-information indicating device 252 is connected to the input and output interface 68 of the computer 72 of the module control device 60 via a control circuit 256 employed by the control device 60.

Determination of Reading Positions and Recognition of Reading Directions

FIGS. 10(a) through 10(d) illustratively show a relationship between a current position of the reading unit 102 on the track and a reading position for the reading unit 102 to read the bar code 92 of each feeder 18. When the reading unit 102 is moved in one direction (i.e., a rightward direction or a leftward direction in the figures) on the track defined by the rail portion 122 while being supported by the support surface 134, for example, when the reading unit 102 is moved in the leftward direction, the reading unit 102 is displaced in the order from a state shown in FIG. 10(a) toward a state shown in FIG. 10(d). Conversely, when the reading unit 102 is moved in the rightward direction, the reading unit 102 is displaced in the order from the state shown in FIG. 10(d) toward the state shown in FIG. 10(a). As described above, the rail portion 122 has the position-indicating holes 162 (see FIG. 7). The pitch at which the holes 162 are formed in the rail portion 122 is equal to the pitch at which the feeders 18 are arranged on the feeder table 20, and the holes 162 are formed in the rail portion 122 such that each of the holes 162 is located at a position right above a middle position between a corresponding pair of feeders 18 located adjacent to each other. As described above, the reading unit 102 has the position detector 156 (see FIG. 8) including the three photoswitches 260. In the figures, the three photoswitches 260 are indicated by respective symbols "A", "B", and "C" in the order from left toward right. A pitch at which the photoswitches 260 are provided is equal to one third of the pitch at which the holes 162 are formed, and the position detector 156 is provided in the reading unit 102 such that the photoswitch "B" is located at a middle position in a widthwise direction of the unit 102. Likewise, the bar-code reader 150 is provided in the reading unit 102 such that the reader 150 is located at the middle position in the widthwise direction of the unit 102.

In each of the states shown in FIGS. 10(a) and 10(d), only the middle photoswitch "B" is in the ON state; in the state shown in FIG. 10(b), only the right photoswitch "C" is in the ON state; and in the state shown in FIG. 10(c), only the left photoswitch "A" is in the ON state. In the states in which only the photoswitch "B" is in the ON state, the bar-code reader 150 cannot read any of the respective bar codes 92 of the feeders 18. The bar-code reader 150 is controlled such that while the reading unit 102 is moved in either one of the two directions, the reader 150 is allowed to read a bar code 92 only in a range within a range between a position where the photoswitch "B" is turned ON and a position where the photoswitch "B" is turned ON again. Therefore, in the present embodiment, the range between each pair of holes 162 located adjacent to each other, where the photoswitch "B" is moved, is pre-set as a reading position corresponding to the feeder 18 located between the each pair of adjacent holes 162. According to this control manner, the controller 200 controls the information reading operation of the reading unit 102.

Meanwhile, when the reading unit 102 is moved in each one of the two directions, the three photoswitches 260 are sequentially turned ON in a corresponding one of two known orders. That is, when the reading unit 102 is moved in the leftward direction, the three photoswitches 260 are sequentially turned ON in the order of "B"→"C"→"A"→"B"; and when the reading unit 102 is moved in the rightward direction, the three photoswitches 260 are sequentially turned ON in the order of "B"→"A"→"C"→"B". Thus, from the order in which the three photoswitches 260 are sequentially turned ON, the direction of movement of the reading unit 102 can be recognized. Thus, the controller 200 has the function of recognizing the direction of movement of the reading unit 102.

Figure 11:
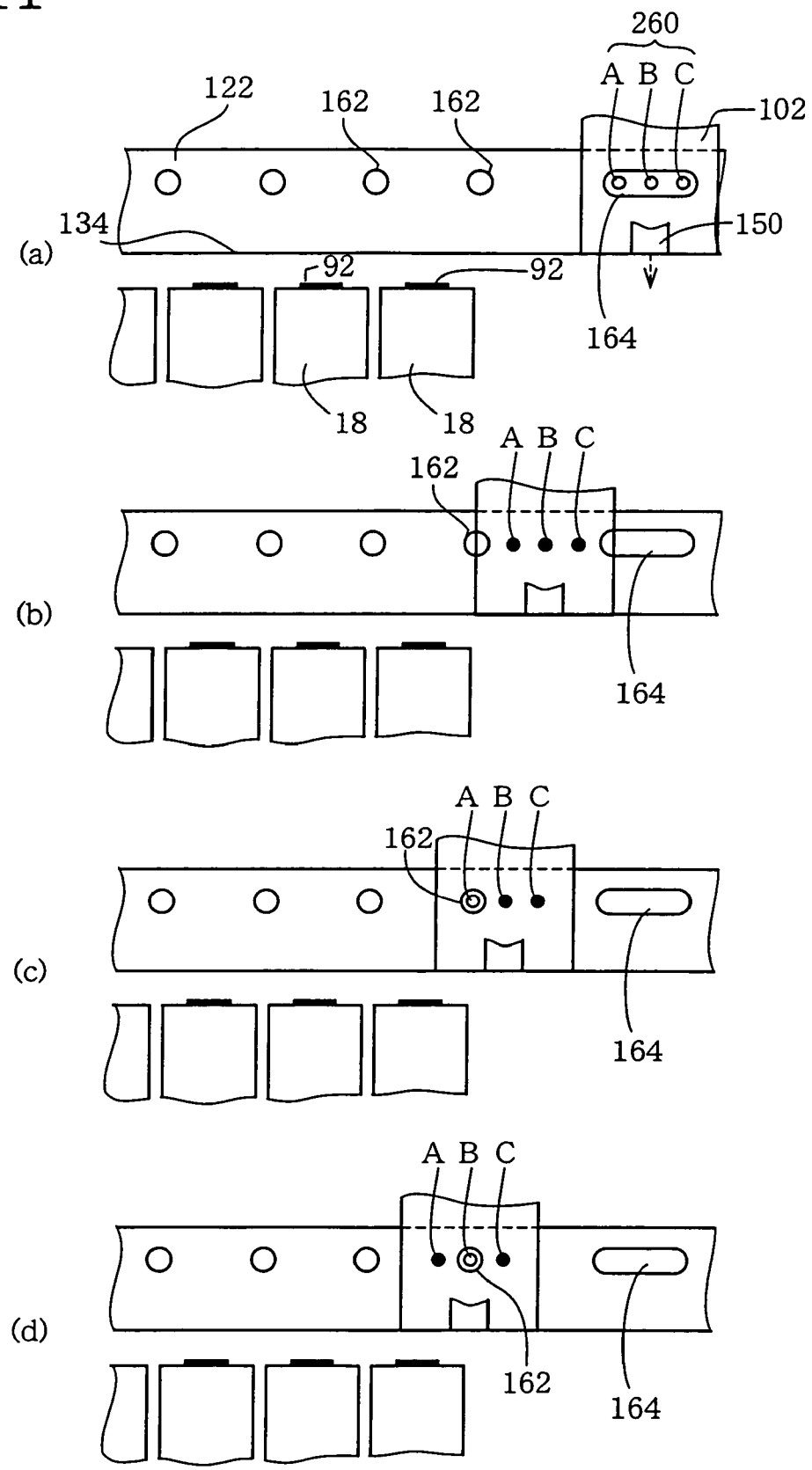
FIG. 11 is an illustrative view for explaining a position of the reading unit when a reading movement of the unit is started or ended.

FIGS. 11(a) through 11(d) illustratively show a current position of the reading unit 102 when the information reading operation of the unit 102 is started or ended. More specifically described, in the case where the reading unit 102 is moved in the leftward direction to perform the information reading operation, the operation is started by a displacement of the unit 102 from a state shown in FIG. 11(a) toward a state shown in FIG. 11(d); and in the case where the reading unit 102 is moved in the rightward direction to perform the operation, the operation is ended by a displacement of the unit 102 from the state shown in FIG. 11(d) toward the state shown in FIG. 11(a). Here, the starting of the reading operation is explained. When the reading unit 102 is moved in the leftward direction from one of the above-described predetermined positions where the unit 102 can be attached to, and detached from, the guide portion 106, first, the unit 102 is brought into the state shown in FIG. 11(a). As described above, the rail portion 122 has the two start-and-end-indicating holes 164 at the respective positions inside the two predetermined positions where the unit 102 can be attached and detached (see FIG. 7). FIG. 11(a) shows the state in which the three photoswitches 260 simultaneously detect the light transmitted through one hole 164, and accordingly are turned ON. Subsequently, as shown in FIG. 11(b), the reading unit 102 is moved to a position where none of the three photoswitches 260 are turned ON. The state shown in FIG. 11(b) is followed by the state shown in FIG. 11(c) in which one of the three photoswitches 260 is turned ON. More specifically described, since the reading unit 102 is moved in the leftward direction, first, the photoswitch "A" is turned ON. Then, as shown in FIG. 11(d), the middle photoswitch "B" is turned ON. In this state, the reading unit 102 is opposed to an outer one of two widthwise ends of one feeder 18 engaged with one outermost slot located at one of the two opposite ends of the array of slots. Therefore, a feeder ID that is read from a feeder 18 by the reading unit 102 positioned there can be recognized as the feeder ID read from the feeder 18 engaged with the outermost slot. Then, the information reading operation illustrated in FIGS. 10(a) through 10(d) is repeated. Since a total number of times by which the photoswitch "B" is turned ON is counted, a feeder ID of each feeder 18 can be read by the reading unit 102, such that the read feeder ID is associated with the position where the each feeder 8 is provided on the feeder table 20.

Though not described in detail, the ending of the information reading operation can be recognized by detecting, after the operation is started, the state in which the photoswitches 260 are simultaneously turned ON as illustrated in FIG. 11(a).

In this way, the determination of each reading position and the recognition of each reading direction are carried out by the controller 200 of the reading unit 102. In the present embodiment, the reading device 100 can be said as including a reading-position determining device that determines each reading position, and a reading control device that controls the bar-code reader 150 to read a bar code 92 at the each reading position. The reading-position determining device includes the through-holes 162, 164 as the position indicators, the position detector 156 including the photoswitches 260, and a portion of the controller 200 that carries out the determination of each reading position; and the reading control device includes a portion of the controller 200 that outputs the command to operate the reading unit 102 to perform the information reading operation. Since the reading-position determining device detects the current position of the reading head 102 on the track and determines each reading position based on the detected position of the unit 102, the reading-position determining device can be said as including a reader-position detecting portion and a reading-position determining portion. In addition, since the reader-position detecting portion detects, as the current position of the reading unit 102, the position of the same 102 relative to one of the through-holes 102 as the position indicators, the reader-position detecting portion can be said as including a position-indicator-related-position detecting portion. As described above in connection with the starting of the information reading operation, the reading device 100 can recognize the respective positions where the through-holes 162 are formed, and accordingly the reading-position determining device can be said as being able to recognize the respective positions where the feeders 18 are provided on the feeder table 20. Moreover, since the reading device 100 can recognize the direction of movement of the reading unit 102, based on the order in which the three photoswitches 260 are turned ON, the reading device 100 can be said as a reader-movement-direction recognizing device including a portion of the controller 200 that carries out the recognition of the direction of movement of the reading unit 102.

Reading of Feeder ID

In the component mounting machine 10, the reading device 100 performs the information reading operation to read the feeder IDs, when the machine 10 is re-set. The information reading operation is briefly described. Here, it is assumed that during the component mounting operation, the guide unit 104 remains attached to one of the mounting modules 14 and the reading unit 102 remains carried by an operator. Therefore, the guide portion 106 of the guide unit 104 is held at the above-described retracted position thereof. When a component mounting operation to mount components on a certain lot of circuit substrates is finished, another component mounting operation to mount components on the next lot of circuit substrates is started. To this end, the operator re-sets the respective component supplying systems 16 of the six mounting modules 14. As described above, the sorts of electronic components to be supplied by the component supplying system 16 of each mounting module 14 are prescribed by the component mounting program. Therefore, according to indications displayed on an operation and display panel of each mounting module 14, the operator places feeders 18 whose reels 24 hold appropriate sorts of electronic components, on respective slots having appropriate Slot Nos.

After all the feeders 18 are placed in each of all the mounting modules 14, the information reading operation to read the feeder IDs is started. First, the information reading operation is performed on one mounting module 14 in which the guide unit 104 remains attached. The operator pushes the guide portion 106 of the guide unit 104 downward to the operative position thereof. Subsequently, the operator attaches the reading unit 102 carried by himself or herself, to the guide portion 106 through one of the two recesses 140 of the engaging portion 124. Then, the operator operates the operation and display panel of the mounting module 14 so as to place the module control device 60 in a state thereof in which the control device 60 can receive information from the reading unit 102. Thus, the reading device 100 is prepared for performing the information reading operation on this mounting module 14. Hence, the operator operates the power switch of the reading unit 102 so as to apply the electric power to the same 102. The application of electric power to the reading unit 102 can be confirmed by recognizing that the power-source lamp 190 is turned on. It, simultaneously, the operator recognizes that the stand-by lamp 192 is turned on, the operator can judge that the reading unit 102 is appropriately attached and the controller 200 of the reading unit 102 is prepared for controlling the information reading operation. Therefore, the operator can start the information reading operation in a manner described below.

Figure 12:
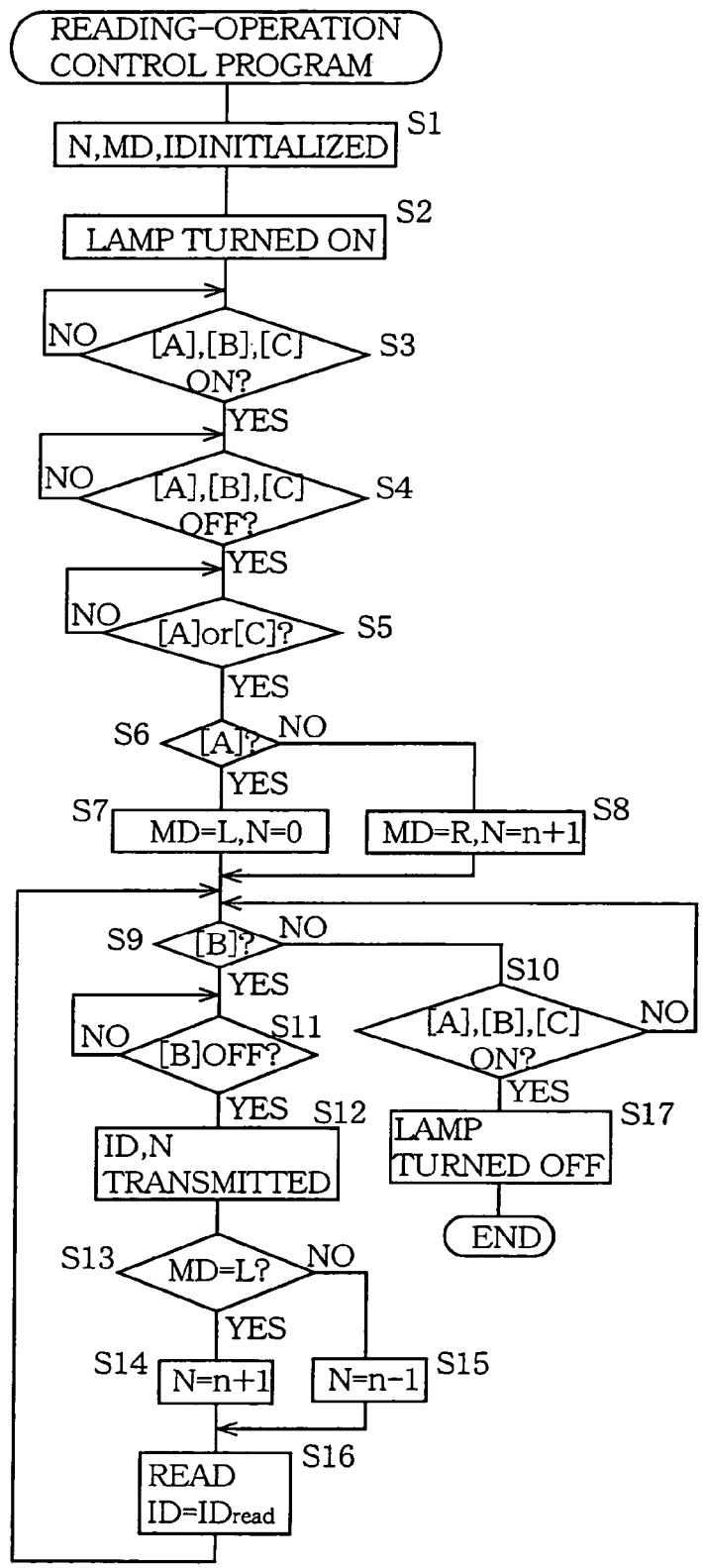
FIG. 12 is a flow chart representing a reading-operation control program that is implemented by a controller of the reading unit.

During the information reading operation, the operator has only to push the reading-movement starting switch 176, just one time, and move, with his or her hand, the reading unit 102 from one of the two recesses 140 to the other recess 140. Thus, the information reading operation is very easy. Meanwhile, during the information reading operation, the reading unit 102 is automatically controlled by the controller 200 according to a reading-operation control program stored thereby. FIG. 12 is a flow chart representing the reading-operation control program that is implemented by the controller 200. Hereinafter, the information reading operation including the operation of the reading unit 102 and the operation of the controller 200 will be described by reference to the flow chart.

When the reading-movement starting switch 176 is pushed by the operator, the implementation of the reading-operation control program is started. First, at Step S1, an initialization operation is carried out to initialize counters, flags, and memories, such as a counter {N} that indicates a Slot No. of a slot on which a feeder 18 is located; a flag {MD} that indicates a direction of movement of the reading unit 102; and an ID memory that stores, as data {ID}, feeder IDs ($ID_{read}$) of feeders 18, read by the bar-code reader 150 from bar codes 92. Subsequently, at Step S2, the reading-movement lamp 194 is turned on.

Next, at Step S3, the controller 200 waits for the reading unit 102 to be positioned at the reading-movement starting position. If the three photoswitches 260 (i.e., the photoswitches "A", "B", "C") are all opposed to one of the two start-and-end indicating holes 164 and are all turned ON (see FIG. 11(a)), the control of the controller 200 proceeds with Step S4. At Step S4, the controller 200 waits for the three photoswitches 260 to be all turned OFF (see FIG. 11(b)). If a positive judgment is made at Step S4, the control goes to Step S5. At Step S5, the controller 200 waits for the reading unit 102 to detect one of the position-indicating holes 162 that is adjacent to the one start-and-end indicating hole 164. If, at Step S5, the one position-indicating hole 162 is detected by the photoswitch "A" or "C" (see FIG. 11(c)), the control goes to Step S6.

At Step S6, the controller 200 judges which one of the photoswitch "A" and "C" has detected the one position-indicating hole 162 at Step S5. In the case where the photoswitches "A" has detected, the controller 200 judges that the reading unit 102 is moved from right to left, i.e., in the leftward direction, and the control goes to Step S7 to set flag {MD} to {MD=L} and set counter {N} to {N=0}. A total number of the slots on which the feeders 18 are provided is n, and respective Slot Nos. of the slots are 1, 2, . . . , n in the order from right to left. The movement of the reading unit 102 in the leftward direction will be referred to as the forward movement. On the other hand, in the case where the photoswitch "C" has detected, the controller 200 judges that the reading unit 102 is moved from left to right, i.e., in the rightward direction, and the control goes to Step S8 to set flag {MD} to {MD=R} and set counter {N} to {N=n+1}. A total number of the slots on which the feeders 18 are provided is n, and respective Slot Nos. of the slots are 1, 2, . . . , n in the order from right to left. The movement of the reading unit 102 in the rightward direction will be referred to as the backward movement.

Then, at Step S9, the controller 200 waits for the photoswitch "B" to detect another position-indicating hole 162 and, at Step S10, the controller 200 waits for the three photoswitches "A", "B", "C" to be all turned ON. Step S10 is for judging whether the reading unit 102 has reached the other start-and-end indicating hole 164 corresponding to the terminal end of the reading movement of the unit 102. Since there are a plurality of reading positions on the way to the end of the reading movement, a plurality of positive judgments are made at Step S9, that is, the photoswitch "B" detects the position-indicating holes 162. If a positive judgment is made at Step S9, the control goes to Step S11.

At Step S11, the controller 200 waits for the photoswitch "B" to pass through the position-indicating hole 162, that is, be turned OFF. If a positive judgment is made at Step S11, the control goes to Step S12 in which the controller 200 transmits, from the infrared-ray transmitter 180, the number counted by counter {N}, and the feeder ID stored as the data {ID} by the ID memory. Thus, the feeder ID of the feeder 18 is transmitted such that the feeder ID is associated with the Slot No. of the slot on which the feeder 18 is provided. The thus transmitted feeder ID is stored by the RAM 66 of the module control device 60. However, when the initial transmission is carried out, the number counted by counter {N} is "0" or "n+1", and no feeder ID is present in the ID memory. Therefore, the initial transmission is neglected by the module control device 60.

Subsequently, at Step S13, the controller 200 recognizes the reading direction indicated by flag {ID}. If the flag indicates the leftward direction, the control goes to Step S14 to add one to the number counted by counter {N}. On the other hand, if the flag indicates the rightward direction, the control goes to Step S15 to subtract one from the number counted by counter {N}. Steps S14 and S15 are for keeping the number, counted by counter {N}, equal to the Slot No. of the slot on which the feeder 18 whose bar code 92 is to be read next is provided. After counter {N} is thus updated, the control goes to Step S16 to start a reading movement. Since the bar-code reader 150 repeats a reading action at a very short time period, Step S16 consists essentially of a time needed to store, in the ID memory, the feeder ID ($ID_{read}$) read as the data {ID} by the reader 150. If one feeder ID is stored in the ID memory, Step S16 is finished. Since Steps S11 through S15 are carried out at a high speed, it is assumed, in the present embodiment, that the reading unit 102 cannot fail to read any feeders ID during the operator's manual movement of the unit 102.

After the reading unit 102 reads the bar code 92 of one feeder 18, the control goes back to Step S9 and the following steps so as to repeat the transmission of data, the updating of counter {N}, and the reading of bar code 92. Thus, the control cycle in accordance with the flow chart is repeated, as needed, so that the respective feeder IDs of all the feeders 18 provided in the component supplying system 16 are read, and are transmitted to the module control device 60. Then, if the controller 200 judges, at Step S10, that the reading unit 102 has reached the terminal end of the reading movement, then the control goes to Step S17 to turn off the reading-movement lamp 194. Thus, the control of the controller 200 quits the reading-operation control program.

In this way, the respective feeder IDs of all the feeders 18 provided in the component supplying system 16 of the mounting module 14 are obtained by the module control device 60, such that the feeder IDs are associated with the respective Slot Nos. of the slots on which the feeders 18 are provided. Then, the module control device 60 judges whether the type of the feeder 18 provided on each slot is appropriate, and judges whether the sort of the electronic components supplied by the feeder 18 provided on each slot is appropriate. Those judgments have been described in detail above. The results of those judgments are indicated by the feeder-information indicating device 252. As described above, if the type of each feeder 18 is appropriate and simultaneously the sort of the electronic components supplied by the each feeder 18 is appropriate, then the LED 254 corresponding to the slot where the each feeder 18 is provided emits the green light; and if not, the LED 254 emits the red light indicating that the type of each feeder 18 is not appropriate or the sort of the electronic components is not appropriate. If there is at least one LED 254 emitting the red light, then the operator inspects the corresponding feeder or feeders 18 so as to specify the reason therefore, and exchanges the inappropriate feeder or feeders 18 with an appropriate feeder or feeders 18. Then, the above-described information reading operation is carried out again. If it is found that all the feeders 18 are appropriate, the operation on the current mounting module 14 is finished, and the operation on the next mounting module 14 is started.

Before the operation on the next mounting module 14 is started, the operator needs to detach the reading unit 102 through an appropriate one of the two recesses 140 of the guide unit 104 attached to the component supplying system 16 of the current mounting module 14. Subsequently, the operator detaches the guide unit 104 from the component supplying system 16 of the current mounting module 14. Then, the operator attaches the guide unit 104 to the component supplying system 16 of the next mounting module 14, and carries out the above-described series of actions needed for obtaining arranged-feeder information. When the operation on the last mounting module 14 is finished, the operation of obtaining the arranged-feeder information from the component mounting machine 10 is finished. In the case where the guide unit 104 is not detached from the last mounting module 14 after the operation thereon is finished, then it is preferred that the guide unit 104 be moved to the retracted position thereof before the next component mounting operation is started on the mounting module 14.

The above-described information reading operation is just an example. In particular, the reading-operation control program has been described with respect to just typical cases for easier understanding. In fact, however, there are special cases. For example, there is a case where feeders 18 are not placed on all the slots of an arbitrary one of the component supplying systems 16. In order to deal with this special case, the above-described reading-operation control program may be modified such that a reading action or actions corresponding to a slot or slots where a feeder or feeders 18 is or are not provided is or are omitted. In addition, there is a case where the operator interrupts one reading movement of the reading unit 102 in one direction, and moves the unit 102 back in the opposite direction. In order to deal with this special case, the reading-operation control program may be modified such that the reading movement of the reading unit 102 can be continued even if the reading movement in one direction may be interrupted and the unit 102 may be moved back in the opposite direction. To this end, the above-described fact that the different directions of movement of the reading unit 102 can be recognized by the different orders of triggering of the three photoswitches 260, may be utilized. Moreover, there is a case where the reading unit 102 fails, for some reason, to read information from an arbitrary one of the feeders 18. In this special case, the reading-operation control program may be modified such that the feeder-information indicating device 252 is utilized, i.e., the LED 254 corresponding to the slot on which the one feeder 18 is provided is turned on.

The invention claimed is:

1. A component-supplying-device-related-information reading apparatus which is used, with a component supplying system including a plurality of component supplying devices each of which supplies a plurality of circuit components, for reading, from an information indicator provided on each of the component supplying devices, component-supplying-device-related information which is related to said each component supplying device, the apparatus comprising:

a guide which defines a track extending in a direction in which the component supplying devices are arranged in the component supplying system;

a reader which is engaged with the guide such that the reader is movable along the track, and which includes an information reading portion which reads, from the information indicator provided on at least one of the component supplying devices, the component-supplying-device-related information related to said at least one component supplying device;

a track-position-change permitting device which permits the track to be selectively changed to at least
(i) a first position to read the component-supplying-device-related information, and
(ii) a second position not to read the component-supplying-device-related information; and a reading-position determining device which determines at least one reading position which is taken by the reader on the track so as to read the component-supplying-device-related information related to said at least one component supplying device, wherein the reading-position determining device comprises a reader-position recognizing portion which recognizes a current position of the reader on the track, and a reading-position determining portion which determines each of a plurality of said reading positions based on the recognized current position of the reader, wherein the reader-position recognizing portion comprises a plurality of position indicators which are provided along the track in the guide such that the position indicators correspond to respective positions where the component supplying devices are provided; and a position-indicator-related-position detecting portion which is provided in the reader and detects that the reader has a predetermined positional relationship relative to one of the position indicators, and wherein the reader-position recognizing portion recognizes the current position of the reader based on a result of the detection.

2. A component-supplying-device-related-information reading apparatus which is used, with a component supplying system including a plurality of component supplying devices each of which supplies a plurality of circuit components, for reading, from an information indicator provided on each of the component supplying devices, component-supplying-device-related information which is related to said each component supplying device, the apparatus comprising:

a guide which defines a track extending in a direction in which the component supplying devices are arranged in the component supplying system;

a reader which is engaged with the guide such that the reader is movable along the track, and which includes an information reading portion which reads, from the information indicator provided on at least one of the component supplying devices, the component-supplying-device-related information related to said at least one component supplying device; and a reading-position determining device which determines at least one reading position which is taken by the reader on the track so as to read the component-supplying-device-related information related to said at least one component supplying device, wherein the reading-position determining device comprises a reader-position recognizing portion which recognizes a current position of the reader on the track, and a reading-position determining portion which determines each of a plurality of said reading positions based on the recognized current position of the reader, wherein the reader-position recognizing portion comprises a plurality of position indicators which are provided along the track in the guide such that the position indicators correspond to respective positions where the component supplying devices are provided; and a position-indicator-related-position detecting portion which is provided in the reader and detects that the reader has a predetermined positional relationship relative to one of the position indicators, and wherein the reader-position recognizing portion recognizes the current position of the reader based on a result of the detection.

3. The component-supplying-device-related-information reading apparatus according to claim 2, wherein the position-indicator-related-position detecting portion detects each one of the position indicators corresponding to the component supplying devices, respectively, and accordingly the reading-position determining device determines each one of the reading positions corresponding to the component supplying devices, respectively.

* * * * *